(12) United States Patent
Wu et al.

(10) Patent No.: US 10,082,530 B1
(45) Date of Patent: Sep. 25, 2018

(54) METHOD AND APPARATUS FOR RAPID AND SCALABLE TESTING OF ANTENNAS

(71) Applicant: The DIRECTV Group, Inc., El Segundo, CA (US)

(72) Inventors: Terence Wu, Torrance, CA (US); Ernest C. Chen, San Pedro, CA (US)

(73) Assignee: THE DIRECTV GROUP, INC., El Segundo, CA (US)

( * ) Notice: Subject to any disclaimer, the term of this patent is extended or adjusted under 35 U.S.C. 154(b) by 311 days.

(21) Appl. No.: 14/102,431

(22) Filed: Dec. 10, 2013

(51) Int. Cl.
*G01R 29/10* (2006.01)
*H01Q 19/12* (2006.01)

(52) U.S. Cl.
CPC .......... *G01R 29/10* (2013.01); *H01Q 19/12* (2013.01)

(58) Field of Classification Search
CPC ........ H01Q 19/20; H01Q 19/12; G01R 29/10; G01R 29/08
USPC .......................................................... 343/703
See application file for complete search history.

(56) References Cited

U.S. PATENT DOCUMENTS

| | | | | |
|---|---|---|---|---|
| 3,302,205 A * | 1/1967 | Johnson | .................. | G01R 29/10 343/703 |
| 4,208,661 A * | 6/1980 | Vokurka | .................. | H01Q 19/20 343/781 P |
| 4,232,322 A * | 11/1980 | De Padova | ............ | H01Q 19/12 343/781 P |
| 4,949,093 A * | 8/1990 | Dhanjal | ................... | H01Q 3/46 343/755 |
| 6,535,176 B2 * | 3/2003 | Spirtus | .................. | H01Q 1/125 343/779 |
| 7,965,228 B2 * | 6/2011 | Dybdal | ................ | G01R 29/105 342/165 |
| 2012/0013516 A1 * | 1/2012 | Ahn | ........................ | H01Q 19/19 343/779 |

FOREIGN PATENT DOCUMENTS

| | | | | |
|---|---|---|---|---|
| WO | WO 86/06550 | * | 11/1986 | ............. H01Q 19/13 |
| WO | WO 1997038464 | * | 4/1997 | ............... H01Q 3/00 |

OTHER PUBLICATIONS

Cooley, "Phased Array-Fed Reflector (PAFR) Antenna Architectures for Space-Based Sensors," Northrop Grumman Electronic Systems, Feb. 2014, 11 pages.*
Hakli et al. "Numerical synthesis method for designing a shaped dual reflector feed system," IEEE Proc.-Microwave Antennas Propagation, vol. 152, No. 5, Oct. 2005, pp. 311-318.*
Johnson et al. "Determination of Far-Field Antenna Patterns From Near-Field Measurements," Proceedings of the IEEE, vol. 61, No. 12, Dec. 1973, pp. 1668-1704.*

(Continued)

*Primary Examiner* — Dieu H Duong
*Assistant Examiner* — Bamidele A Jegede
(74) *Attorney, Agent, or Firm* — Gates & Cooper LLP

(57) ABSTRACT

A system and method for testing an antenna feed to be incorporated into an operational antenna is disclosed. The system and method uses a scaled reflector with the antenna feed to permit testing that correlates well with a full sized reflector, yet permits testing in a quiet zone of a compact antenna test range. Embodiments are also disclosed for offset feed designs.

16 Claims, 22 Drawing Sheets

(56) References Cited

OTHER PUBLICATIONS

Lee et al., "Pattern Measurements of Reflector Antennas in the Compact Range and Validation with Computer Code Simulation," IEEE Transactions on Antennas and Propagation, vol. 38, No. 6, Jun. 1990, pp. 889-895.*

Fournier "Freedom Reflector Design with Extended Sources, A dissertation submitted in partial fulfillment of the requirements for the degree of Doctor of Philosophy in CREOL, the College of Optics and Photonics at the University of Central Florida Orlando, Florida, Summer Term 2010, p. 76".*

Mitchell et al. "Scaling Charcteristics of Inflatable Paraboloid Concentrators, The American Society of Mechanical Engineerings, Solar Engineering, Book No. H00630-1991".*

Davis et al. "Reflector Efficiency Evaluation by Frequency Scaling" IEEE Transactions on Antennas and Propagation, vol. AP-19, No. 1, Jan. 1971.*

* cited by examiner

METHOD AND APPARATUS FOR RAPID AND SCALABLE TESTING OF ANTENNAS

BACKGROUND

1. Field of the Invention

This disclosure relates to systems and methods for measuring antenna characteristics, and in particular to a system and method for measuring the characteristics of offset feed dish antennas.

2. Description of the Related Art

Traditionally, television programming has been delivered to viewers at home by very high frequency (VHF) and ultra high frequency (UHF) transmission from local broadcasting facilities. In the 1980s, dish antennas and receivers became available, allowing home viewers to receive television programming directly from satellite transmissions. Typically, however, these dish antennas were large and unsightly, and required professional installation. In the 1990s, satellite television service evolved to include smaller offset-feed dish antennae and specially designed receivers. These smaller dish antennas are visually unobtrusive and much easier to install.

One means to assure adequate performance of the dish antennas is to test their components before assembly and/or to test the antenna after assembly to confirm that they meet design specifications. However, such testing is typically prohibitively expensive because accurate testing requires that the testing be performed in large anechoic chambers which are not easily incorporated into an assembly line.

What is needed is a system and method for production testing antennas and their components during and after assembly. The system and methods disclosed herein satisfy this need.

SUMMARY

To address the requirements described above, this application discloses a method and apparatus for determining a characteristic of an operational antenna system that includes an antenna feed at a first operational antenna system location relative to a first operational antenna system reflector characterized by a first focal length $F_R$, a first major axis dimension $W_R$, and a first minor axis dimension $L_R$. Instead of using the operational antenna reflector for testing, a test antenna reflector is used, wherein the test antenna reflector is characterized by a test antenna reflector focal length $F_r$, smaller than the operational antenna system parabolic reflector, a test antenna major axis dimension $W_r$ scaled from the operational antenna system reflector major axis dimension $W_R$ according to a scale factor $R_{FL}$ determined at least in part from a ratio of the operational antenna system reflector focal length to the test antenna reflector focal length $(F_r/F_R)$, and a test antenna system reflector minor axis dimension $L_r$, scaled from the operational system reflector minor axis dimension $L_R$ according to the scale factor $R_{FL}$. The apparatus further comprises a boom, for holding the antenna feed at test antenna system location, scaled relative to the first antenna reflector from the first operational antenna system location according to the scale factor $R_{FL}$.

A method of determining the characteristic of the operational antenna is also disclosed. One embodiment of the method comprises positioning the antenna feed at a test antenna system location relative to a first reflector, providing electromagnetic energy to the antenna feed via the test antenna system reflector, receiving the electromagnetic energy in the antenna feed and generating an antenna feed output at least in part therefrom, and determining the characteristic at least in part from the output.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which is shown, by way of illustration, several embodiments of the disclosed system and method. It is understood that other embodiments may be utilized and structural changes may be made without departing from the scope of the disclosure and claims.

Overview

This disclosure describes production-friendly system and method of measuring performance characteristics of antennas and their components. Such characteristics include the cross-polarization of low noise block converter with feed (LNBF), antenna gain and adjacent satellite rejection.

Cross polarization of the LNBF is measured by reflecting the signal off of a miniaturized reflector that is a scaled version of the reflector actually used in the final production antenna. Strong correlation between the measured cross-polarization performance using the scaled reflector and using the operational reflector is observed, allowing the cross polarization performance of a fully assembled antenna to be quantified by measuring with a mini-reflector in a smaller compact antenna range (CATR). Antenna gain and adjacent satellite rejection can also be measured with the use of the miniaturized reflector, with similarly good results after the scale factor is properly accounted for.

Distribution System

Figure 1:
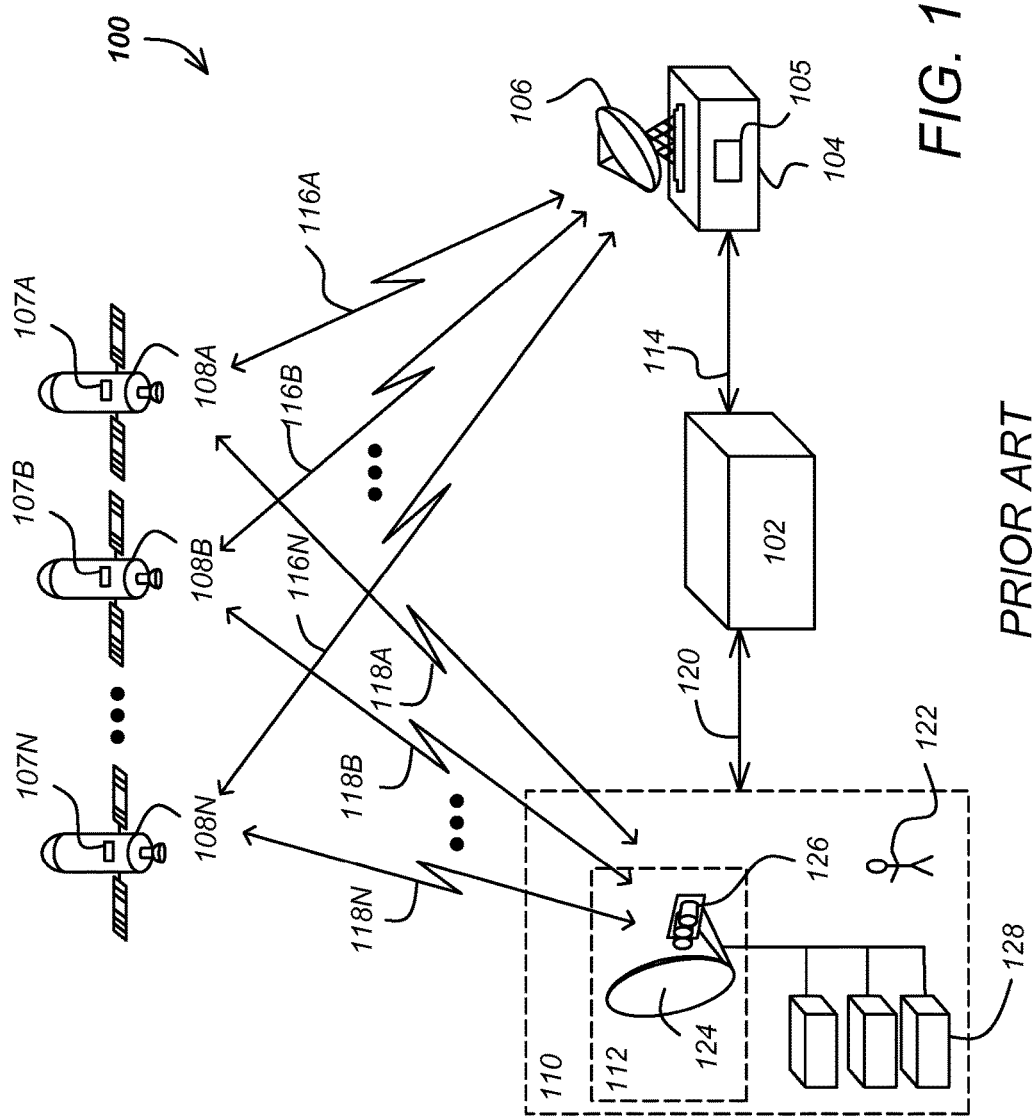
FIG. 1 is a diagram illustrating an overview of a distribution system that can be used to provide video data, software updates, and other data to subscribers.

FIG. 1 is a diagram illustrating an overview of a distribution system 100 that can be used to provide video data, software updates, and other data to subscribers 122. The distribution system 100 comprises a control center 102 in communication with an uplink center 104 via a ground or other link 114 and with a subscriber receiver station 110 via a public switched telephone network (PSTN), Internet, or other link 120. The control center 102 provides program material (e.g. video programs, audio programs, software, software/firmware updates, and/or other data) to the uplink center 104 and coordinates with the subscriber receiver stations 110 to offer, for example, broadcast television or pay-per-view (PPV) program services, including the associated decryption of transmitted data and programs and billing for PPV programs.

The uplink center 104 receives program material and program control information from the control center 102, and using an uplink antenna 106 and transmitter 105, transmits the program material and program control information to one or more satellite(s) 108A-108N (hereinafter alternatively collectively referred to as satellites 108). The satellite(s) 108 receive and processes this information, and re-transmit the video programs and control information to one or more subscriber receiver stations 110 via downlinks 118A-118N using one or more transmitters 107A-107N (hereinafter alternatively collectively referred to as downlinks 118 and transmitters 107, respectively). In one embodiment, the transmitters 107 are transponders that receive, frequency translate, and retransmit the received signals in a "bent pipe" configuration. A transponder typically comprises a bandpass filter, a low noise amplifier, a frequency translator, and output bandpass filter and a power amplifier, such as traveling wave tube amplifier (TWTA).

The orbital locations of satellites 108 are typically fixed by regulation, so, for example, there may be a satellite 108A at 101 degrees West Longitude (WL), another satellite 108B at 110 degrees WL, and another satellite at 119 degrees WL, satellite 108N. Other satellites may be at other orbital slots, e.g., 72.5 degrees and 95 degrees may also be included, without departing from the scope of this disclosure.

Each satellite 108 may have a plurality of transponders 107, each generating one of the downlink signals 118 using the information received in the uplink signals 116. These downlink signals 118 are typically located in the Ku-band of frequencies, i.e., 11-18 GHz. Other satellites typically broadcast in the Ka-band of frequencies, i.e., 18-40 GHz. In one embodiment, the downlink signals 118 are directed towards specific geographic areas for reception using beamforming or mechanical techniques.

The receiving stations 110 receive this information using an outdoor unit (ODU) 112 that is typically installed on the outside of a home or other structure, and provides the received information to one or more receivers or integrated receiver/decoders (IRDs) 128.

In the illustrated embodiment, the ODU 112 comprises a subscriber antenna having a reflector 124 and one or more LNBFs 126 that receive the electromagnetic energy reflected by the reflector 124. Each LNBF 126 comprises one or more feeds that sense the electromagnetic energy reflected by the reflector 124 as well as low noise block converting electronics for receiving the electromagnetic energy sensed by each feed and amplifying and downconverting that energy to lower frequencies for transmission over wires or coaxial cable to one or more of the receivers 128.

Typically, the ODU 112 comprises at least one feed for satellite 108 in the system, thus permitting the reception of a plurality of downlink signals 118 without requiring mechanical steering of the ODU 112. The one or more of the receivers 128 select the appropriate feed in LNBF 126 that is at the focal point of the reflector 124 for the satellite 108 transmitting the desired downlink signal 118. This permits the ODU 112 to remain stationary, yet receive downlink signals from satellites 108 at different apparent positions in the sky.

Receivers 128 decode the signals provided by the ODU 112. The received signals are typically packetized into a plurality of data packets, each with a system channel identifier (SCID) corresponding to a viewer channel. The receivers 128 include modules that select the packets identified by the SCID associated with a selected viewer channel, decrypts and decodes the data packets, assembles the packets into a data stream, which, following optional conversion into an analog television signal, is then passed to television or other viewing device for display to the subscriber 122.

In one embodiment, ODU 112 comprises an offset feed antenna such as an 18-inch slightly oval-shaped Ku-band reflector 124. The offset feed configuration positions the LNBF 126 so it does not block the electromagnetic energy from the downlink signals 118 from reaching the entire surface area of the reflector 124, thus minimizing attenuation of the incoming signal. The 22.5 degree offset feed configuration is also characterized by a reflector 124 which is approximately elliptical in rim shape when viewed from the axis of symmetry of the reflector 124.

Channel diversity (the ability to transmit independent channels of information) can be provided by frequency diversity (via the use of different transponder 107 frequency bands centered at particular transponder 107 frequencies), time division diversity (in which the signals 118 transmitted by each transponder comprise a plurality of time division multiplexed data packets, spatial diversity (in which one or more of the satellites 108 uses beamforming techniques to transmit downlink signals 118 only to particular geographical areas and not other areas), polarization diversity (in which a particular transponder 107 transmits signals of different and independent polarizations), or any combination thereof. Other channelizing techniques such as code division multiple access (CDMA), orthogonal frequency division modulation (OFDM), or coded OFDM may also be employed.

Antenna systems and their subsystems can be described by a number of characteristics, including cross-polarization and beamwidth. Cross-polarization (hereinafter alternatively referred to as X-pol) refers to the antenna's ability to reject signals that are polarized orthogonally to the desired signal. For example, downlink signals 118 provided by the satellites 108 can include both Right Hand Circularly Polarized (RHCP) and Left Hand Circularly Polarized (LHCP) signals. In this case, cross-polarization refers to an antenna system's ability (or that of one of its components, such as the feed or LNBF 126) to reject the LHCP signal when the RHCP signal is desired or vice-versa.

Cross-polarization arises because an antenna is never 100% polarized in a single mode. Cross polarization may be specified as a power level in negative decibels (dB), indicating how many decibels the power level of the undesired signal is below the power level of the desired signal of the orthogonal polarization. The cross-polarization of elements of an antenna system can be defined and measured. For example, the cross-polarization of each feed of the LNBF 126 may be measured.

Beamwidth refers to the usable sensitivity of the antenna system around the centerline or boresight of the antenna's sensitive axis. Typically, an antenna system is most sensitive at the boresight, and the sensitivity becomes reduced as vector to the source of the electromagnetic energy moves away from the boresight.

Figure 2B:
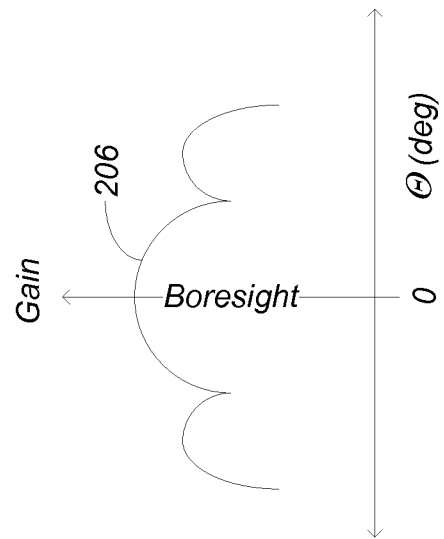
FIG. 2B is a diagram illustrating a typical sensitivity pattern.
Figure 2A:
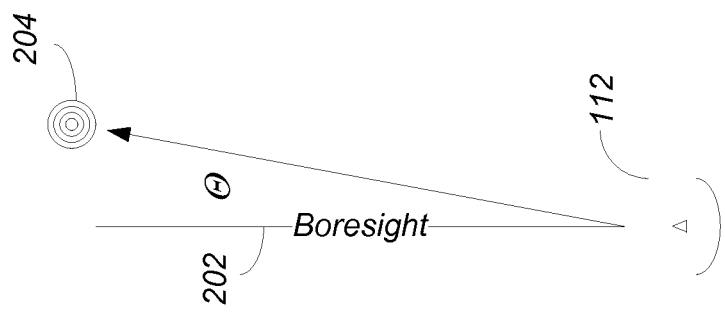
FIG. 2A is a diagram illustrating an ODU or antenna system and an angle θ away from boresight towards the source of electromagnetic energy.

FIG. 2A is a diagram illustrating an ODU 112 or antenna system and an angle θ away from boresight 202 towards the source of electromagnetic energy 204. FIG. 2B illustrates a typical sensitivity pattern, showing antenna system 112 gain as a function of angle off of boresight 202.

In satellite applications, beamwidth as well as the antenna's near-in pattern is important for purposes of adjacent satellite rejection (ASR), as the beamwidth must be sufficiently narrow for the antenna system 112 to receive signals from the desired satellite 108 with high gain and reject undesired signals from other satellites 108.

Figure 3:
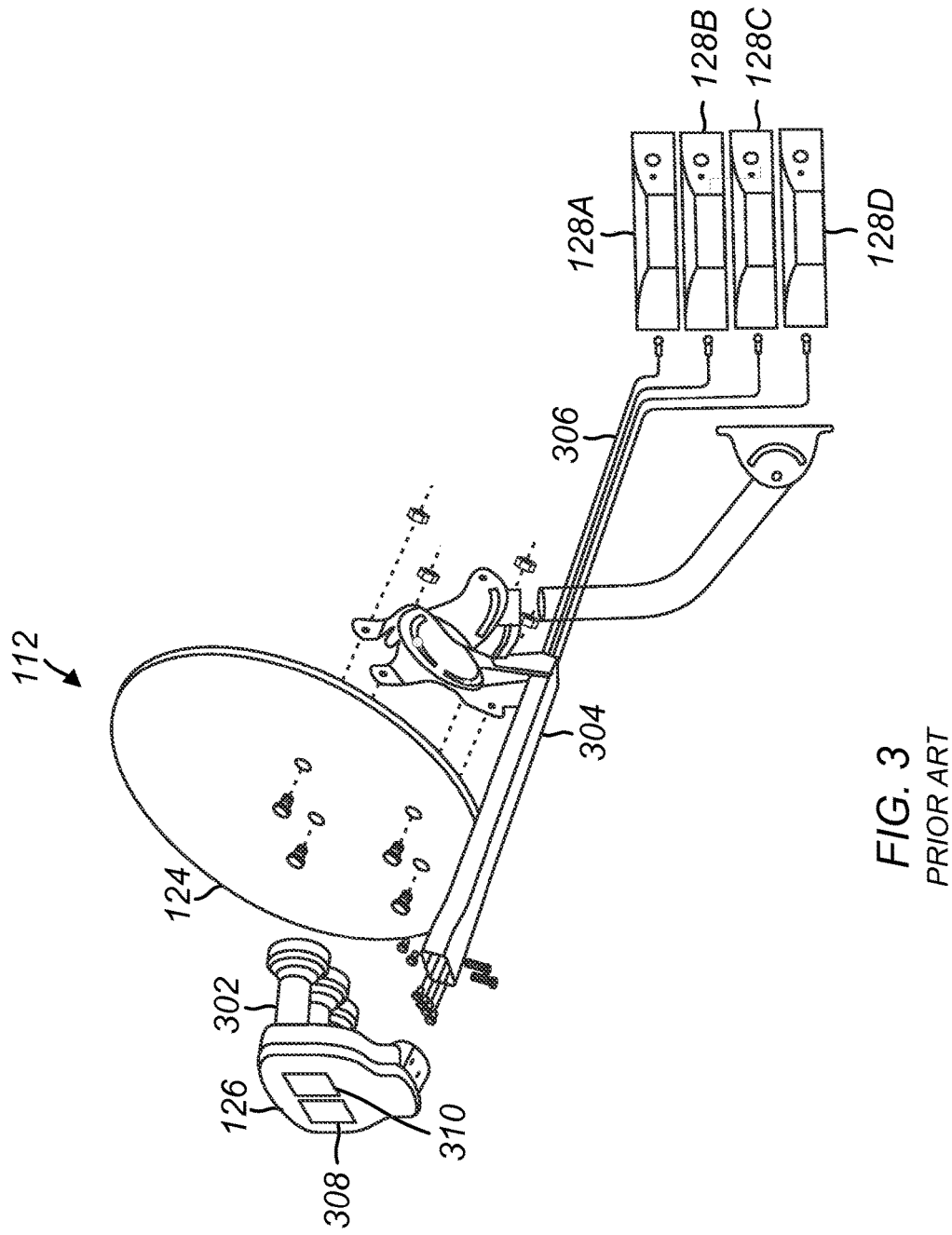
FIG. 3 is a diagram illustrating one embodiment of a typical ODU, having a feedhorn assembly with a plurality of feeds.

FIG. 3 is a diagram illustrating one embodiment of a typical ODU 112, having an LNBF 126 with a plurality of feeds or feed horns 302. The reflector 124 directs downlink signals 118 to the feed horns 302 of the LNBF 126.

Reflector 124 and LNBF 126 are typically mounted on bracket 304 and attached to an exterior surface of a subscriber's home or other structure. Typically, the reflector 124 is directed toward the southern sky (such as from a location in northern hemisphere) and roughly aligned with the satellite downlink 118 beam, and then the reflector 124 and LNBF 126 is more finely oriented using a power meter or other alignment tools. In one embodiment, the LNBF 126, comprises five feeds 126 and an LNB 310 that accepts the signals from the feed horns 302, frequency converts the signals and outputs the downconverted signals as they are selected by the receivers 128 through a communicatively coupled multi-switch 308 to the receivers 128. The multi-switch 308 can be built into the LNBF 126 or external to the LNBF 126. It is also possible for each feed 302 to comprise its own LNB 310.

The aggregate signal from feeds 126 is connected via wires or coaxial cables 306 to a multiswitch 308, which can be located within LNBF 126 (as illustrated), elsewhere on the ODU 112, or in the subscriber's home. As described above, LNBF 126 accepts radio frequency (RF) (e.g. Ka, Ku band) downlink 118 signals reflected by the reflector 124, and downconverts the signals to lower frequency signals (typically L-band frequencies ranging from 950 MHz to 2150 MHz) that are easily transmitted by wire or cable to the receiver(s) 128. This downconversion makes it possible to distribute the signals within a home using standard coaxial cables.

The multiswitch 308 responds to commands from the receivers 128 to selectively activate feeds 302 to select the downlink signals 118 from a particular satellite 108, and deliver these signals via one or more cables 306 to the requesting receiver 128. In one embodiment, each feed 302 can receive both orthogonal polarizations at the same time with parallel sets of electronics.

Figure 4A:
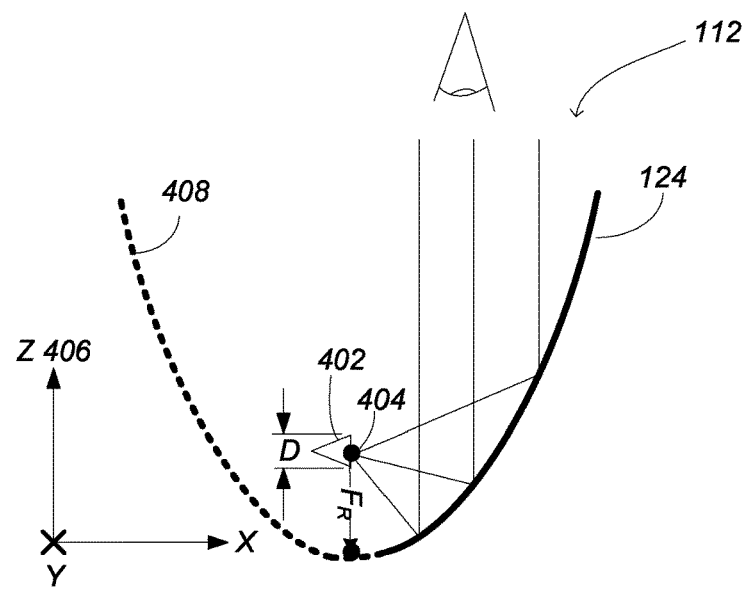
FIGS. 4A and 4B are diagrams further illustrating the reflector and a feed of an operational ODU.
Figure 4B:
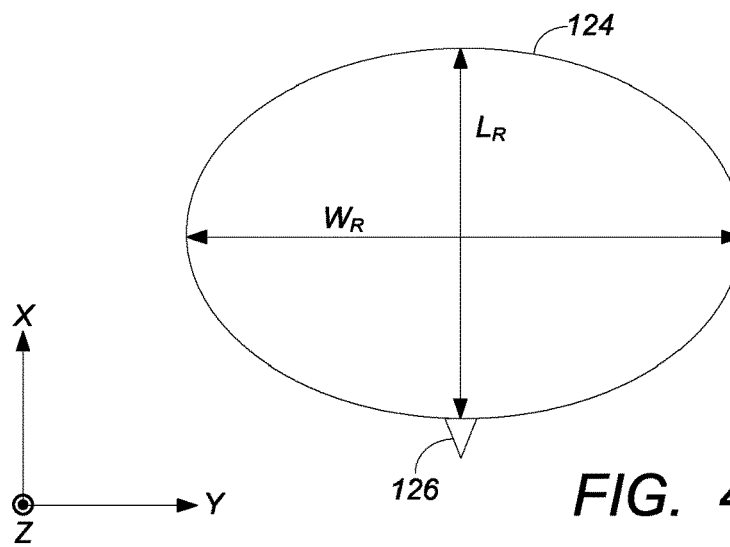

FIGS. 4A and 4B are diagrams further illustrating the reflector 124 and a feed 402 of an operational ODU 112. As shown in FIG. 4A, the reflector 124 has a substantially parabolic cross section, and therefore focuses the electromagnetic energy from the satellite 108 to a focal point 404 a distance $F_R$ from the vertex of the reflector 124. The vertex is the point of symmetry in the superscribing paraboloid 408. The paraboloid of FIGS. 4A and 4B can be defined by $$Z = \frac{x^2 + y^2}{4F_R}$$

where Z is the direction of the incoming signal from the satellite.

The aperture of the antenna feed 402 has a finite dimension D and is disposed at the focal point 404, with the sensitive axis of the feed 402 directed to receive the electromagnetic energy of the downlink signals 118 reflected by the reflector 124.

FIG. 4B is a diagram looking from the perspective of the satellite transmitting a signal to the reflector 124 and feed. As shown in FIG. 4B, the reflector 124, when viewed along its axis of symmetry 406, i.e., the Z axis, has a elliptical shape and the reflector can be characterized by a major axis dimension $W_R$ and a minor axis dimension $L_R$.

As described above, to assure proper performance of the antennas used to receive the downlink signals 118, the performance characteristics of the antenna components can be tested, both before and after assembly. One such antenna characteristic is the antenna's cross-polarization performance. The cross-polarization performance of an ODU 112 is highly dependent on the cross polarization performance of the LNBF 126. In particular, production variation in the LNB 310 electronics and die-cast dimensions of the feed 302 greatly changes the cross-polarization performance of the ODU 112 in which the LNBF 126 is installed. Hence, it is desirable to accurately measure LNBF 126 performance characteristics with the reflector in a cost effective way to control production variations in the factory producing the antennas.

Previous techniques of predicting the ODU 112 or antenna cross-polarization include (1) measuring the cross polarization of the antenna feed or LNBF (1) alone and (2) with a production (full-size) reflector in a far field anechoic chamber or a compact antenna test range (CATR).

The first technique is inadequate because the cross polarization of the feed 302 cannot accurately determine the polarization of the feed 302 or LNBF 126 with the reflector 124, but rather, a summation of the cross-polarization across the angular span of the operational beamwidth of the feed 302 or LNBF 126 would be required. Because of the close proximity of the LNBF 126 to the reflector 124 in a production antenna, that angular span is relatively wide. Hence, to correlate well with the LNBF's use with an operational reflector 124, that cross polarization of the LNBF 126 must be determined and processed over a wide angular extent. However, measuring LNBF 126 cross polarization at multiple angles is very time consuming and is not suitable for quick production verification/testing.

Measuring LNBF 126 cross polarization with a production ODU reflector 124 in an anechoic chamber is the most accurate testing technique, but is costly for high volume production testing, and the physical volume required for an anechoic chamber in a far field can be prohibitively large.

The size of the anechoic chamber can be reduced by use of a compact antenna test range (CATR). A CATR is a facility which is used to provide convenient testing of antenna systems at frequencies where obtaining far-field spacing to the antenna under test (AUT) would be infeasible using traditional free space methods. The "far-field" is the region in which the field acts as "normal" electromagnetic radiation, that is, the power of this radiation decreases as the square of distance from the antenna, and absorption of the radiation has no effect on the transmitter. Further, the shape of the antenna pattern (e.g. as illustrated in FIG. 2B) is independent of the distance to the source and the angular field distribution is in essence independent of distance from the source.

The CATR uses a source antenna which radiates a spherical wavefront and one or more main reflectors to collimate the radiated spherical wavefront into a planar wavefront within the desired test zone, which encompasses a quiet zone. The collimated wavefront emulates a far-field condition.

The CATR is typically used for microwave and millimeter wave frequencies, where the $2D^2/\lambda$ far-field distance is large, such as with high-gain reflector antennas (D is the largest dimension of the test antenna.) The size of the CATR range that is required can be much less than the size required for a full-size far-field anechoic chamber, although the cost of fabrication of the specially-designed CATR reflector can be expensive due to the need to ensure precision of the reflecting surface (typically less than $\lambda/100$ RMS surface accuracy) and to specially treat the edge of the reflector to avoid diffracted waves which can interfere with the desired beam pattern.

Even with the use of a CATR, measurement of antenna characteristics requires a large anechoic chamber to provide a "quiet zone" enveloping the entire volume of the antenna reflector 124. Since the size of a CATR is proportional to its quiet zone, reducing the size of the reflector used in the test reflector allows reduction in the size of the CATR. Accordingly, the CATR can accurately measure cross-polarization of an LNBF 126 with the reflector, and thus accurately predict the performance of an ODU 112 using that LNBF 126.

Figure 5:
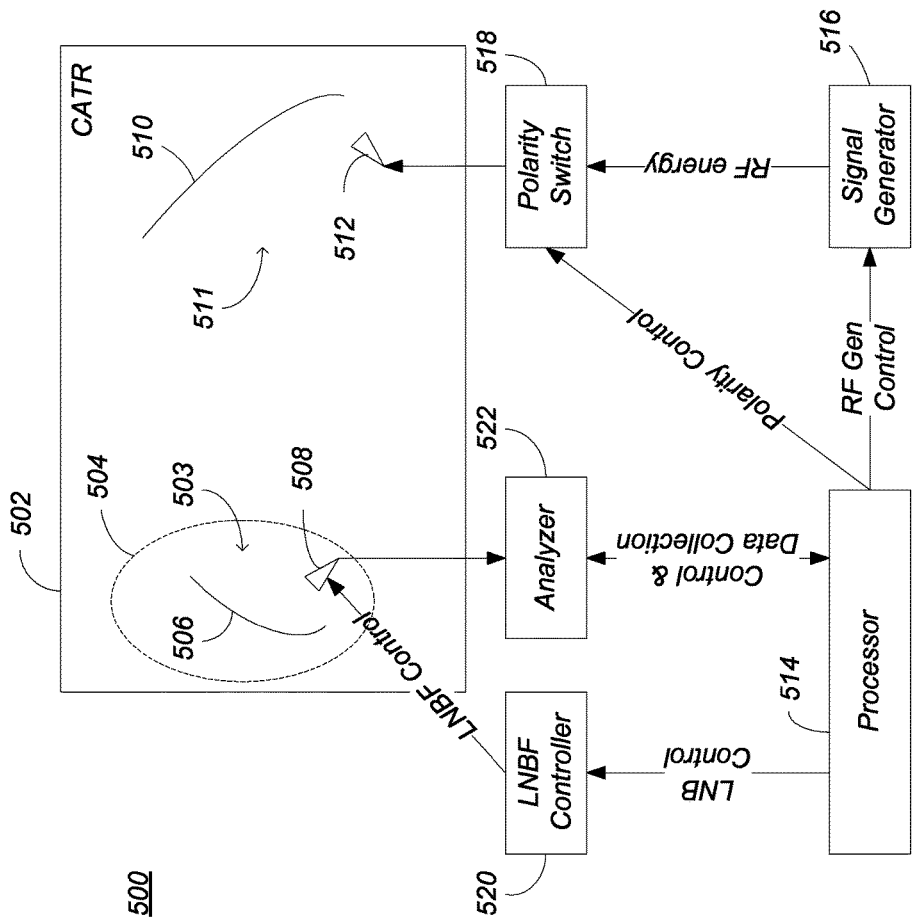
FIG. 5 is a diagram illustrating one embodiment antenna test apparatus.

FIG. 5 is a diagram illustrating one embodiment antenna test apparatus (ATA) 500. The ATA 500 includes a compact antenna test range (CATR) 502 having a source antenna 511 using a horn feed antenna 512 and a parabolic reflector 510 to provide electromagnetic energy.

Inside the CATR 502 is a quiet zone 504 enveloping a test antenna 503, which comprises a test antenna feed 508 and a test antenna reflector 506. As described above, while it is desired to test ODUs before deployment to subscribers, it is expensive and difficult to test them, as such testing requires an anechoic chamber or CATR 502 large enough to permit the reflector 124 of the operational antenna to be placed within the quiet zone 504. This problem is ameliorated by the technique discussed below wherein the antenna feed 508 is tested with a test reflector 506 that is scaled to a size smaller than the deployed reflector 124. Using a smaller test reflector 506, a smaller quiet zone 504 and hence, a CATR 502 of greatly reduced size is possible. Further, when the test antenna feed 508 is used with a standard size reflector 124 of the deployed ODU 112, the antenna characteristics measured with the scaled reflector 506 correlate well with the antenna characteristics measured with the same test antenna feed 508 and a standard size reflector 124.

FIG. 5 also depicts other ATA 500 components, including a processor 514 that controls test components and accepts data for further processing and reporting. The source feed 512 is provided with energy in the frequencies of interest by a radio-frequency (RF) signal generator 516, which may be controlled by the processor 514. The polarity (e.g. polarization) of the RF energy provided to the source feed 512 may be selected via polarity switch 518 communicatively coupled between the signal generator and the source feed 512, under control of the processor 514.

The source feed 512 emits electromagnetic energy at the selected polarization and frequency, and this energy is reflected by source reflector 510 in the direction of the test antenna assembly 503. The electromagnetic energy is reflected by the test reflector 506 of the antenna assembly 503 towards the test antenna feed 508 of the antenna assembly 503. The output of the test antenna feed 508 is provided to an analyzer 522 such as a spectrum analyzer, and thereafter to the processor 514 for data analysis. The test antenna feed 508 may be disposed in an LNBF 126, which amplifies and frequency-translates the received signal, and which can selectively provide a signal from the received electromagnetic energy of different polarizations (e.g. RHCP and LHCP) according a command from the LNBF controller 520 as determined by the processor 514.

Scaled Test Antenna Reflector

The size of the scaled test antenna reflector 506 is preferably set according to the far field condition of the antenna feed under test (AFUT) 508. The far field distance X is:

$$X \geq \frac{2fD^2}{c} \quad \text{(Equation 1)}$$

where c is the speed of light, and D is the largest test antenna feed 508 aperture dimension and f is the highest operating frequency of the feed.

Figure 6A:
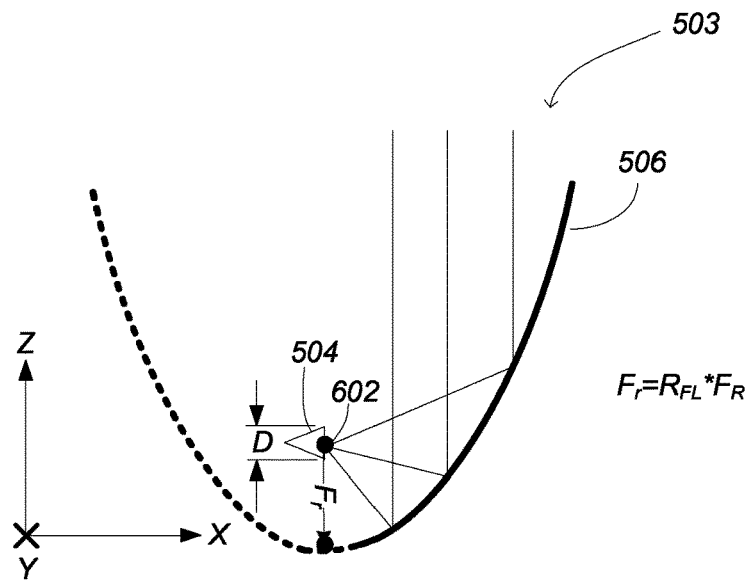
FIGS. 6A-6C are diagrams of the test antenna feed in use with a scaled test antenna reflector.
Figure 6B:
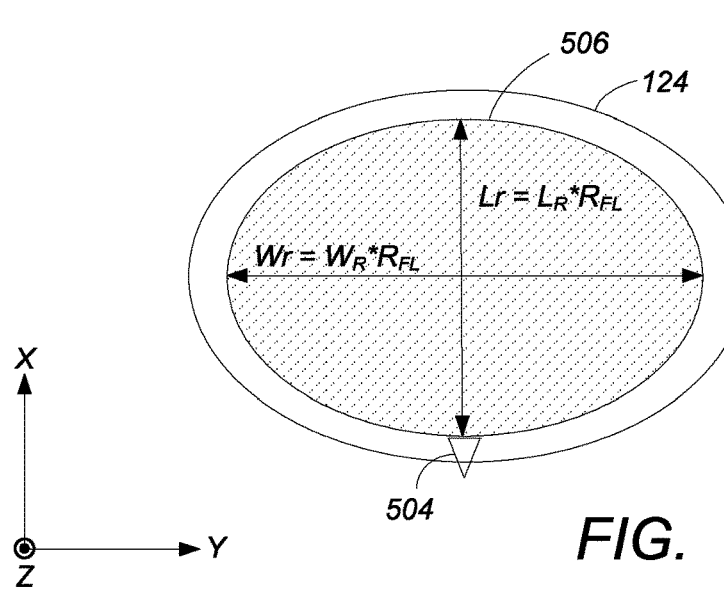
Figure 6C:
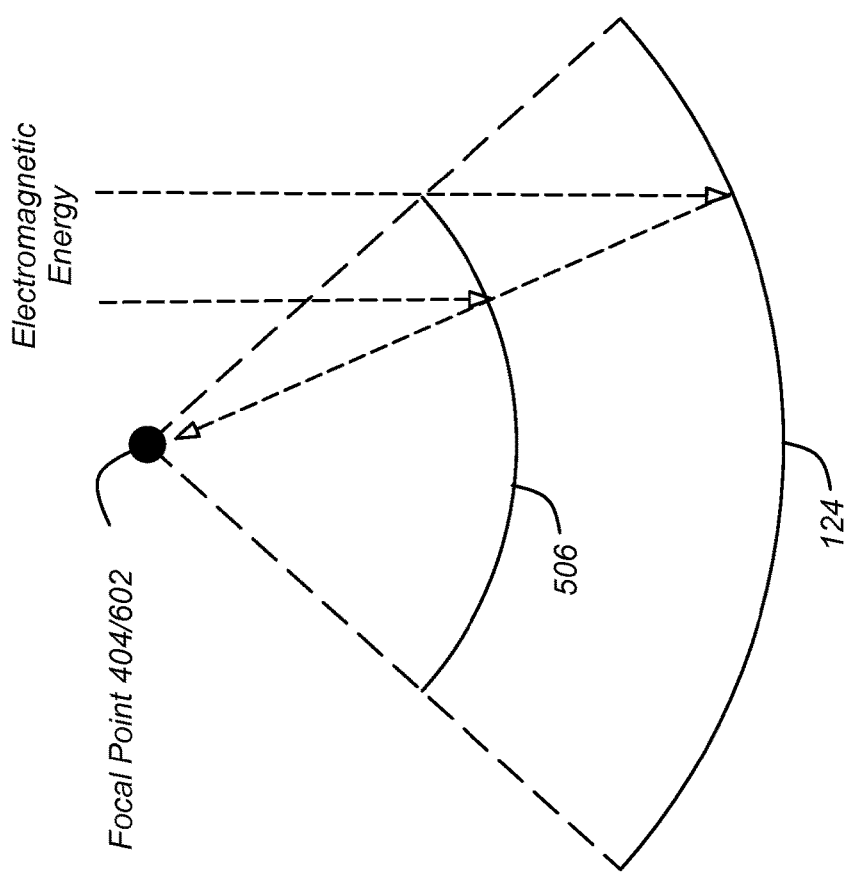

FIGS. 6A-6C are diagrams of the test antenna feed 508 in use with a scaled test antenna reflector 506. The focal length of the scaled test antenna reflector 506 is set to X to test if the scaled test antenna reflector 506 is in far field of the test antenna feed or LNBF 504 just like it would be with a standard size reflector 124. $R_{FL}$, the ratio between the dimensions $W_r$ and $L_r$ of the scaled test antenna reflector 506 and the dimensions $W_R$ and $L_R$ of the full-size reflector 124, is obtained by dividing X to the focal length of the full-sized antenna or ODU 112, $FL_{ODU}$. All of the dimensions of the scaled test antenna reflector 506 can be obtained by multiplying $R_{FL}$ by the full-size reflector 124 dimensions. The result is described in Equation 2 below:

$$R_{FL} = X/FL_{ODU} \quad \text{(Equation 2)}$$

All of the dimensions of the scaled test antenna reflector 506 can be obtained by multiplying the full sized reflector 124 dimensions by the above scale factor $R_{FL}$ as shown in FIG. 6B. For example, the dimension $W_r$ can be determined as the product of $W_R$ and $R_{FL}$, and the dimension $L_r$ can be determined as a product of $L_R$ and $R_{FL}$.

Note that the reflector scales in three dimensions and the focal point 404/602 remains the same. Also, the full sized 124 and scaled 506 reflectors are illuminated by the same feed pattern over the relevant look angles. The antenna gain (and hence the antenna pattern) for a full sized reflector at an angle $\theta_1$ from boresight 202 will not generally have the same gain as a scaled test antenna reflector 506 at angle $\theta_2 R_{FL}$. However, the gain will have the same theoretical value if scaled according to the relationship $\sin(\theta_1)=\sin(\theta_2)R_{FL}$. Hence, an antenna pattern for a full sized ODU 112 can be derived by using a feed with scaled reflector 506.

Further Scaling of the Test Antenna Reflector

Figure 7A:
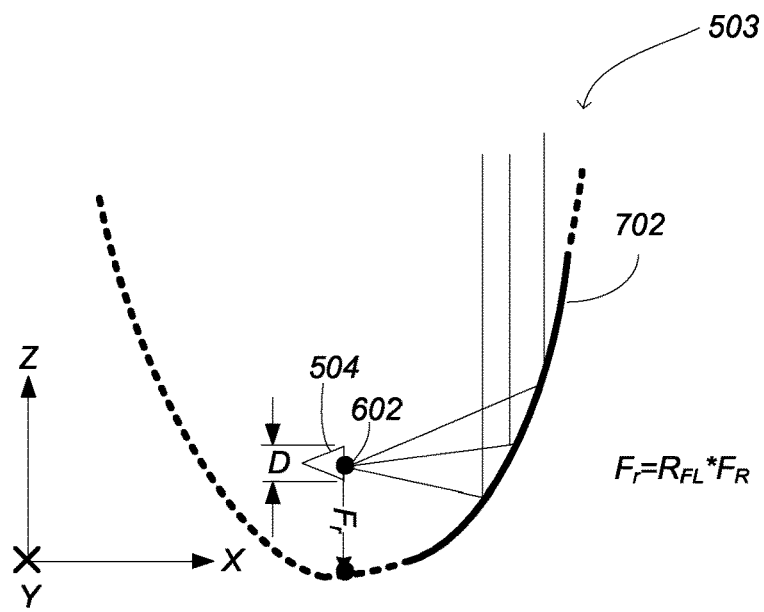
FIGS. 7A and 7B are diagrams illustrating another embodiment of the scaled test antenna reflector.
Figure 7B:
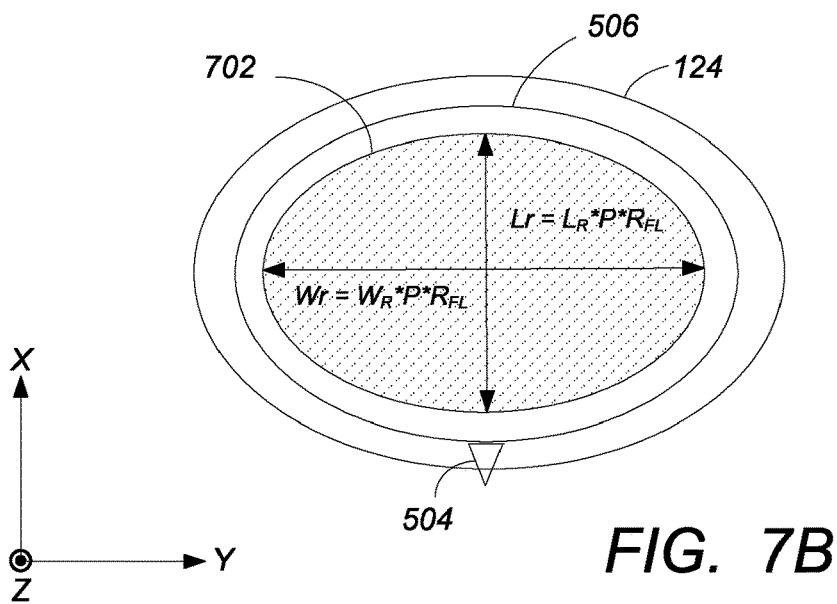

FIGS. 7A and 7B are diagrams illustrating another embodiment of the scaled test antenna reflector. In this embodiment, the size of the scaled test antenna reflector 506 is further reduced by further scaling the dimensions from the outer edges of the scaled test antenna reflector 506, while keeping the focal length unchanged from the initially scaled reflector.

The energy collected by the feed 508 is greatest at the center of the scaled test antenna reflector 506 and least towards the edge of the scaled test antenna reflector. Typically, the proportion of energy collected follows a normal (Gaussian) distribution in each axis ($W_r$ and $L_r$), with the peak at the center of the scaled test antenna reflector 506 and the tails of the distribution at the edges. By further scaling the width and length of the scaled test antenna reflector 506 by a further scale factor P, the scaled test antenna reflector 506 can be made even smaller without violating the far field criteria from the test feed 504 dimensions. For referential simplicity, the further scaled reflector 702 and the scaled reflector 506 are both referred to as scaled reflectors 506.

Cross Polarization Attenuation Measurement Correlation

Figure 8:
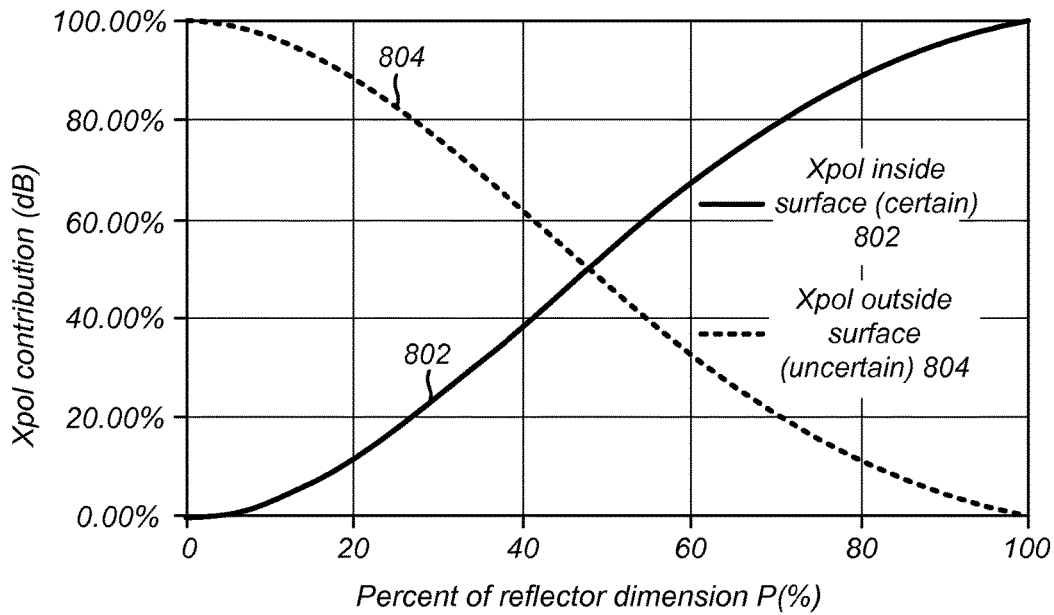
FIG. 8 is a diagram plotting the relationship between the cross-polarization energy inside a further scaled test antenna reflector as a function of a scale factor P.
Figure 9A:
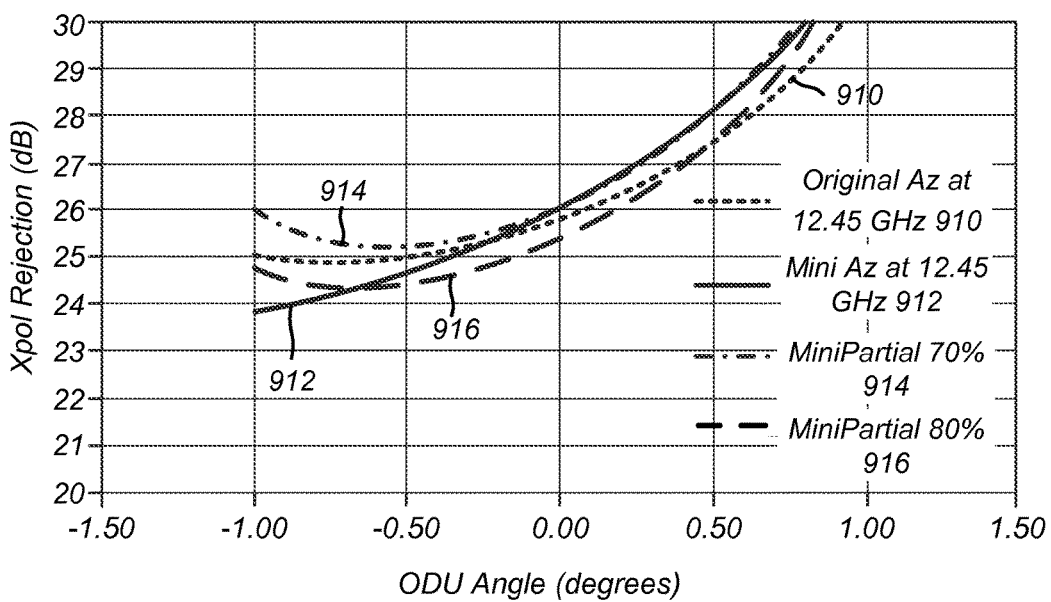
FIGS. 9A-9D are diagrams comparing computer-simulated cross polarization rejection using different embodiments of the scaled test antenna reflector.
Figure 9B:
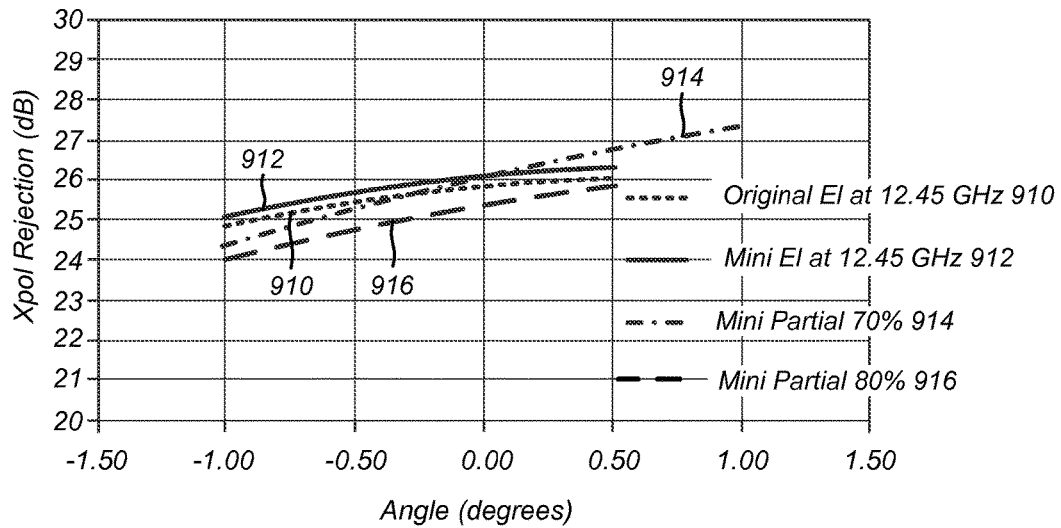
Figure 9C:
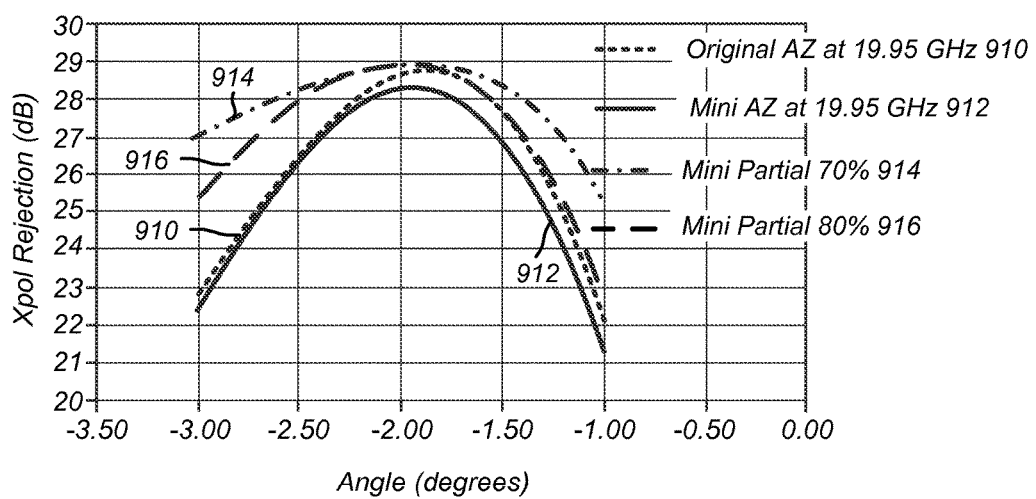
Figure 9D:
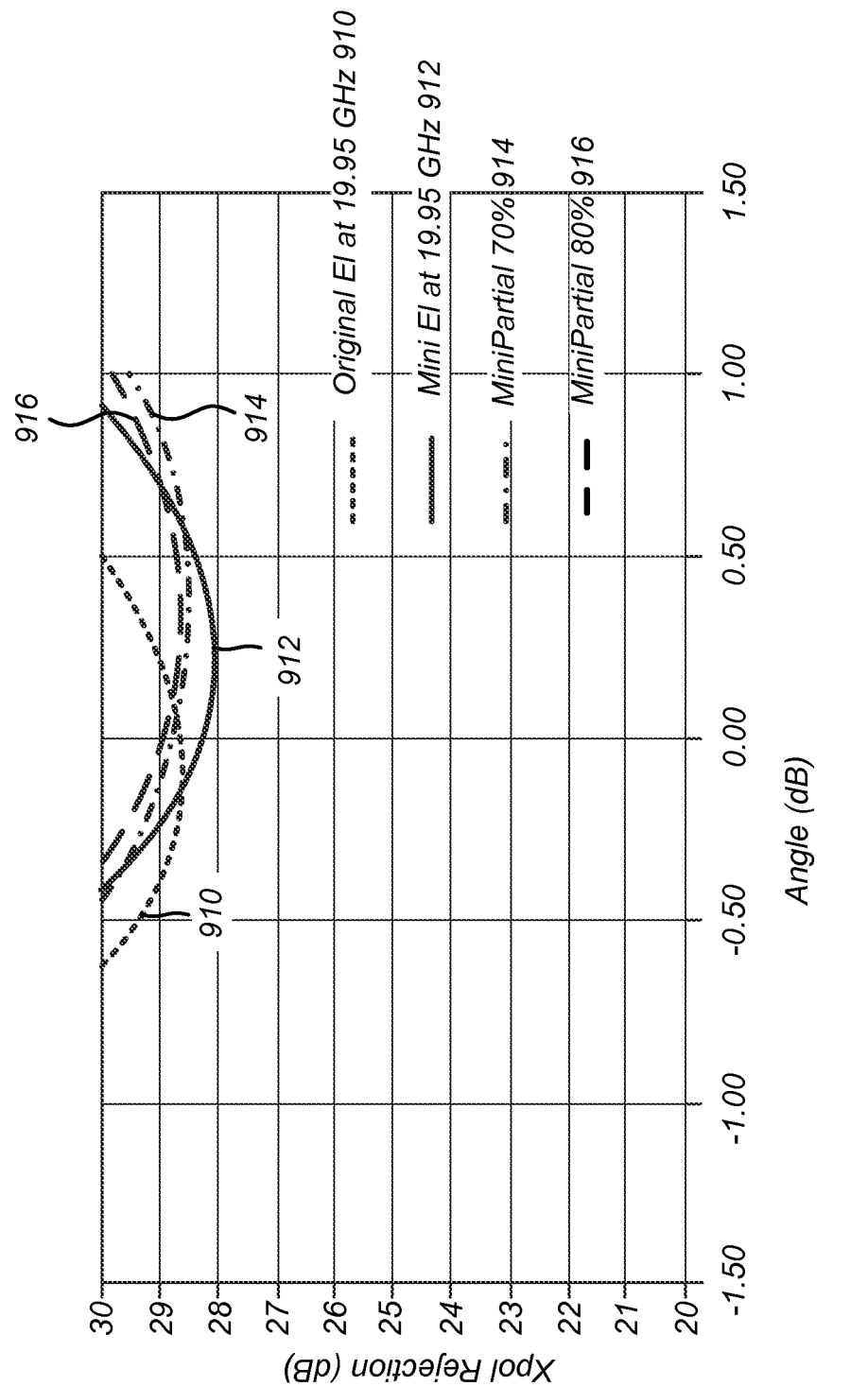

FIGS. 8-9D are diagrams illustrating the correlation of cross-polarization measurements with a full size reflector 124 and the further scaled test antenna reflector 602 based on scale factor P.

FIG. 8 plots a modeled relationship between the cross-polarization energy (in dB) inside the further scaled test antenna reflector 702 as a function of the further scale factor P. A Gaussian shape for the cross-pol pattern is assumed. Note that when the scale factor is 0.2, only about 10% of the cross-polarization energy falls inside the dimensions of the further scaled test antenna reflector 702, while 90% of the cross-polarization energy falls outside the further scaled test antenna reflector. The co-polarization component follows a similar reduction in power as the P factor gets smaller. Thus the ratio of the two powers, which is the cross-pol isolation being measured, remains relatively independent of the fact that the reflector is further reduced. The shape of the curve describing the cross polarization energy inside the further scaled test antenna reflector 802 and outside the further scaled test antenna reflector 804 are shaped like a normal cumulative probability density function, a reflection of the normal distribution of energy on the further scaled test antenna reflector 702.

As can be seen in FIG. 8, a tradeoff between area reduction and the correlation of the cross polarization measurement using a standard sized and scaled reflector can be derived. For example, when P=80%, 90% of the cross-polarization energy will be accounted for by the further scaled test antenna reflector 702 surface. By measuring 90% of the cross-polarization energy using only 80% of the reflector 702 dimensions, this is more size efficient than using 100% of the scaled test antenna reflector 504.

In the case where reflector size is equally important to measurement accuracy, the optimum value for P is 0.67 or 67%, and 76% of the cross-polarization energy can be measured. To obtain sufficiently high Xpol measurement accuracy, P is selected to be greater or equal to 0.67.

FIGS. 9A-9D are diagrams comparing calculated cross polarization rejection (dB) using different embodiments of the scaled test antenna reflector 504 using the same feed 508. FIG. 9A illustrates measured cross polarization rejection for f=12.45 GHz (Ku) in the azimuth direction (along $W_R$), while FIG. 9B illustrates measured cross polarization rejection for f=12.45 GHz in the elevation direction (along $L_R$). Similarly, FIG. 9C illustrates measured cross polarization rejection for f=19.95 GHz (Ka) in the azimuth direction (along $W_R$), while FIG. 9D illustrates measured cross polarization rejection for f=19.95 GHz in the elevation direction. The Ka feed in this example is offset in azimuth by −2 deg.

Plot 910 illustrate the theoretical cross polarization rejection for a full sized reflector 124. Plot 912 illustrate the theoretical cross polarization rejection for a scaled test antenna reflector 506. Plot 914 illustrate the theoretical measured cross polarization rejection for a scaled test antenna reflector 506 that is further scaled by P=0.7 (70%). Plot 916 illustrate the theoretical cross polarization rejection for a scaled test antenna reflector 506 that is further scaled by P=0.8 (80%). Note that although the cross polarization rejection varies with the look angle of the ODU 112, a high degree of correlation in the measured cross polarization rejection is achieved, even for the further scaled reflectors. Some of the decorrelation is due to blockage by the feed 504 shadowing a greater percentage of the surface area of the scaled reflector 506 or further scaled reflector 702.

Adjacent Satellite Rejection (Antenna Pattern) Measurement Correlation

Adjacent satellite rejection (ASR) refers to the ability of the antenna to reject signals from satellites in adjacent or nearby orbital locations. The ASR of an ODU 112 can be determined through measuring the antenna pattern, with particular attention paid to the width of the main node 206 around boresight as shown in FIG. 2B.

ASR can also be measured by use of the scaled reflector 506, with the resulting measurements correlating well with analogous measurements made with a full sized reflector 124.

Figure 10A:
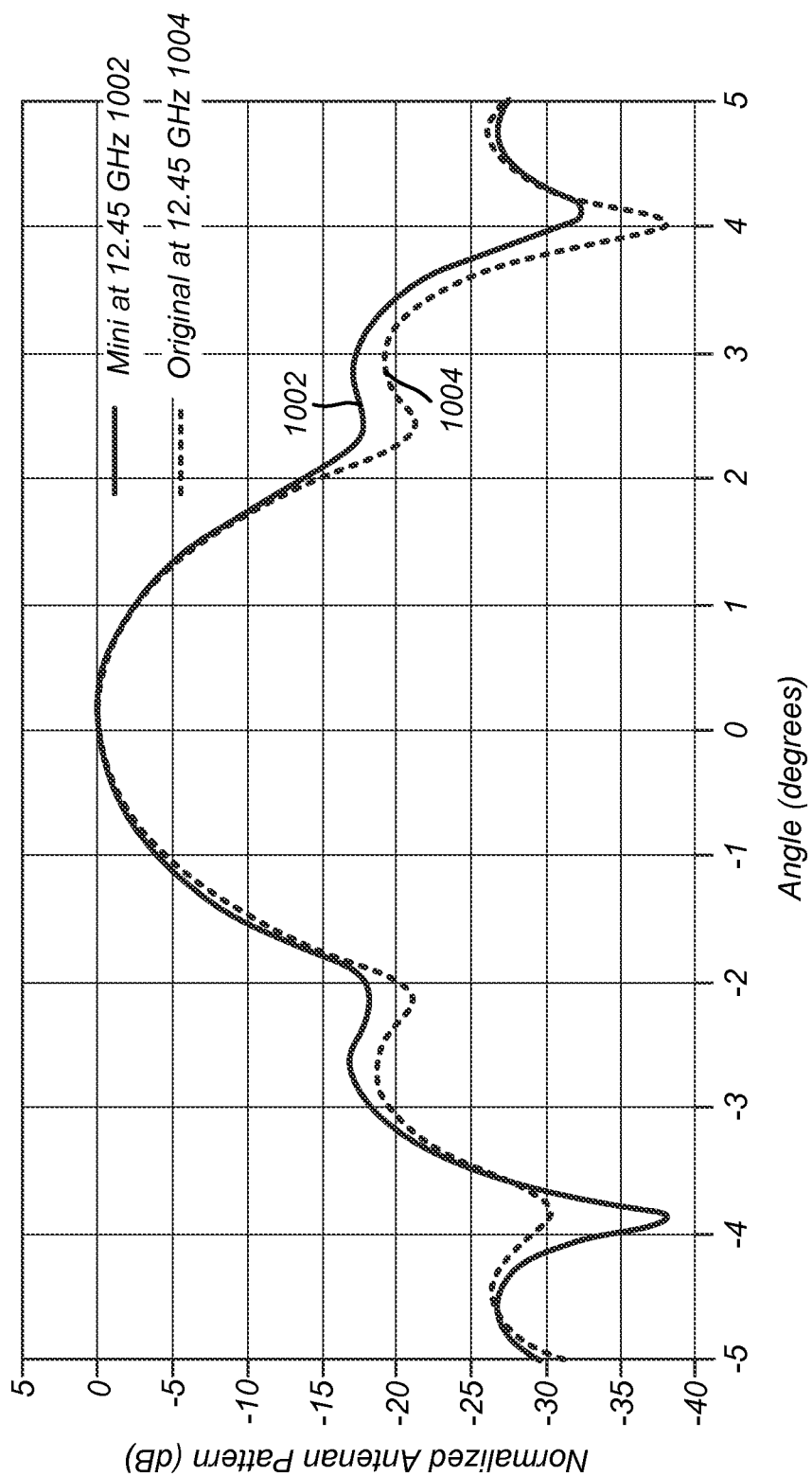
FIGS. 10A and 10B illustrate a normalized antenna pattern, showing gain versus look angle.
Figure 10B:
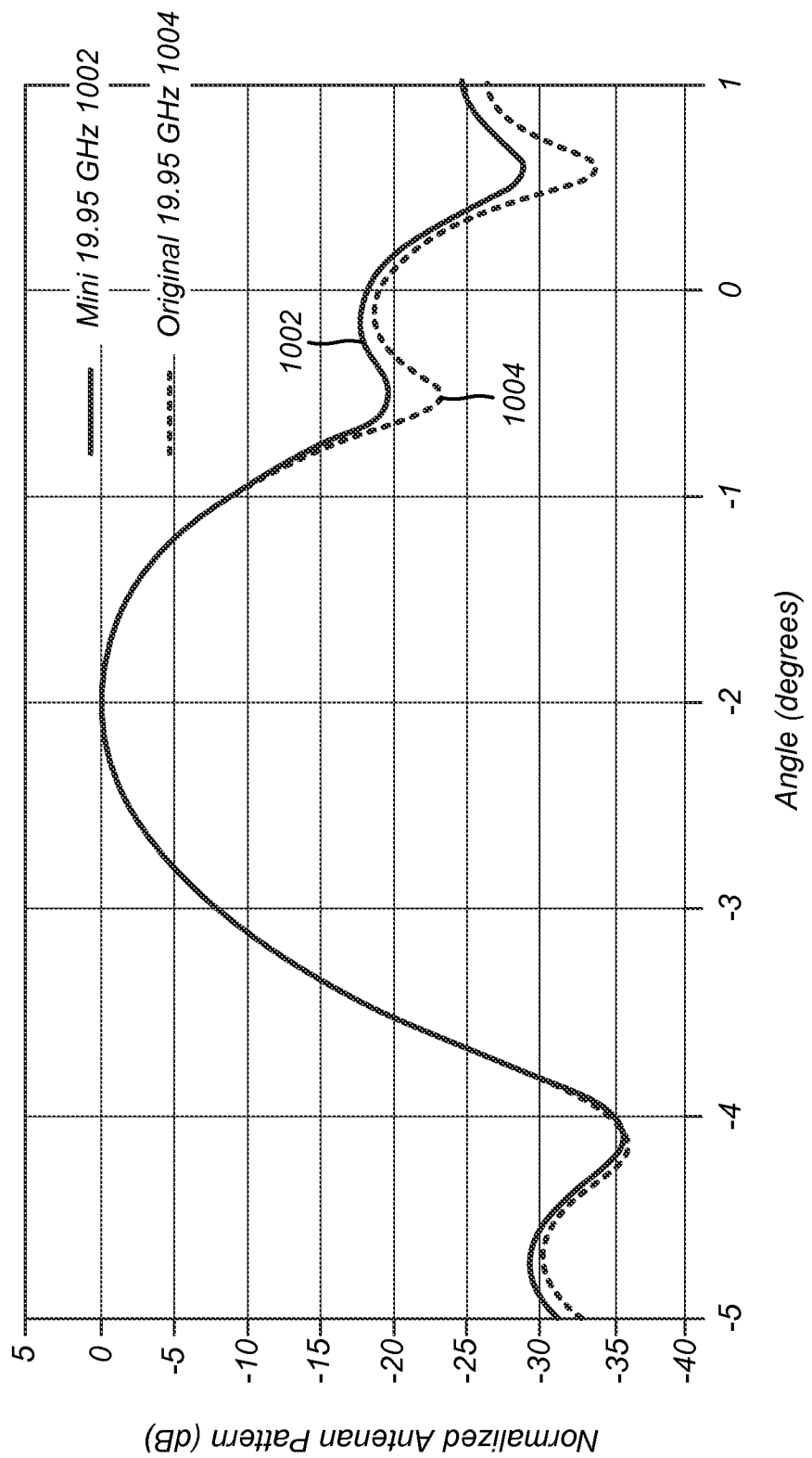

FIGS. 10A and 10B illustrate a normalized antenna pattern, showing relative gain (dB) versus look angle, for f=12.45 GHz and 19.95 GHz, respectively. Plots 1002 show the result for a scaled reflector 506, while plots 1004 show the result for the full sized reflector 124.

In this example, $R_{FL}$=0.4 and P=1.0, and the angle data of the scaled reflector 506 has been approximately scaled by multiplying by a factor of $1/R_{FL}$ to directly correlate to the angles of the full sized reflector 124. Note that with regard to beamwidth (the width of the main node), the results for the scaled reflector 506 and full sized reflector 124 are in substantial agreement.

Antenna Gain

The foregoing techniques can also be used to measure antenna gain. A feed tested with the scaled test antenna reflector 506 will typically produce a gain scaled (reduced) by $\Delta G(dB)=20(\log_{10}/R_{FL}))$. Therefore, the antenna gain with the operational reflector 124 can be inferred by determining the gain with the scaled test antenna reflector 506, and adding this $\Delta G(dB)$ gain to the measured antenna gain (in dB).

Improving Correlation for Out of Focus Feeds

As shown in FIG. 1 and FIG. 3, a typical ODU 112 comprises a feedhorn assembly 302 that has a plurality of LNBAs 126, with for example two of the LNBAs 126 positioned off axis. Such LNBFs are referred to as multi-feed LNBFs.

As described above, this permits the ODU 112 to receive signals from satellites in different orbital locations (and hence, different apparent positions in the sky), by switching between LNBAs 126. For example, if the center LNBA 126 is placed at the focal point 402 of the antenna, an offset adjacent LNBA may be offset in the azimuth direction from the center LNBA, and thus, receive signals from another directions. This permits the sensitive axis of the ODU 112 to be selected based upon which LNBA 126 is activated to receive the downlink signal 118 from the satellite 108.

For multi-feed LNBFs 126 where the secondary feeds are far from focal point, the correlation of the cross polarization, antenna gain and antenna pattern between measurements taken with a full-sized reflector 126 and a scaled reflector 504 will be reduced. One way to improve the correlation is to use an adjustable arm to physically position the feed closer to the focal point of the mini-reflector and consistent with the scaling.

Figure 11A:
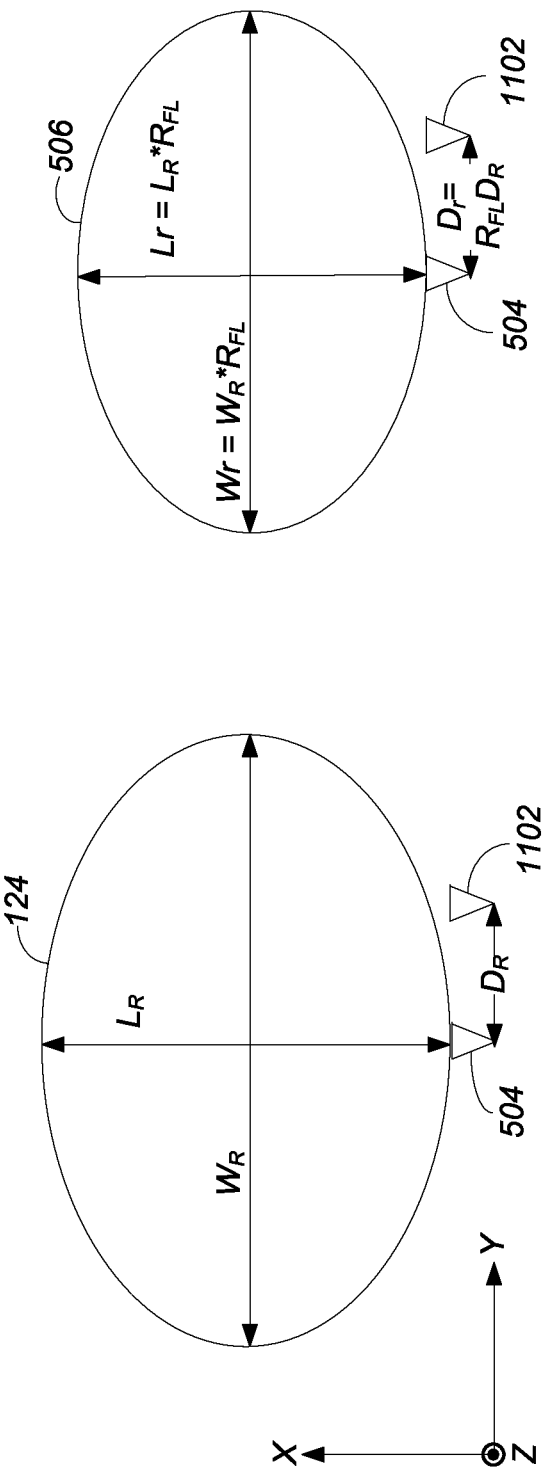
FIGS. 11A-11B is a diagram showing how antenna measurement correlation can be improved for offset feeds.
Figure 11B:
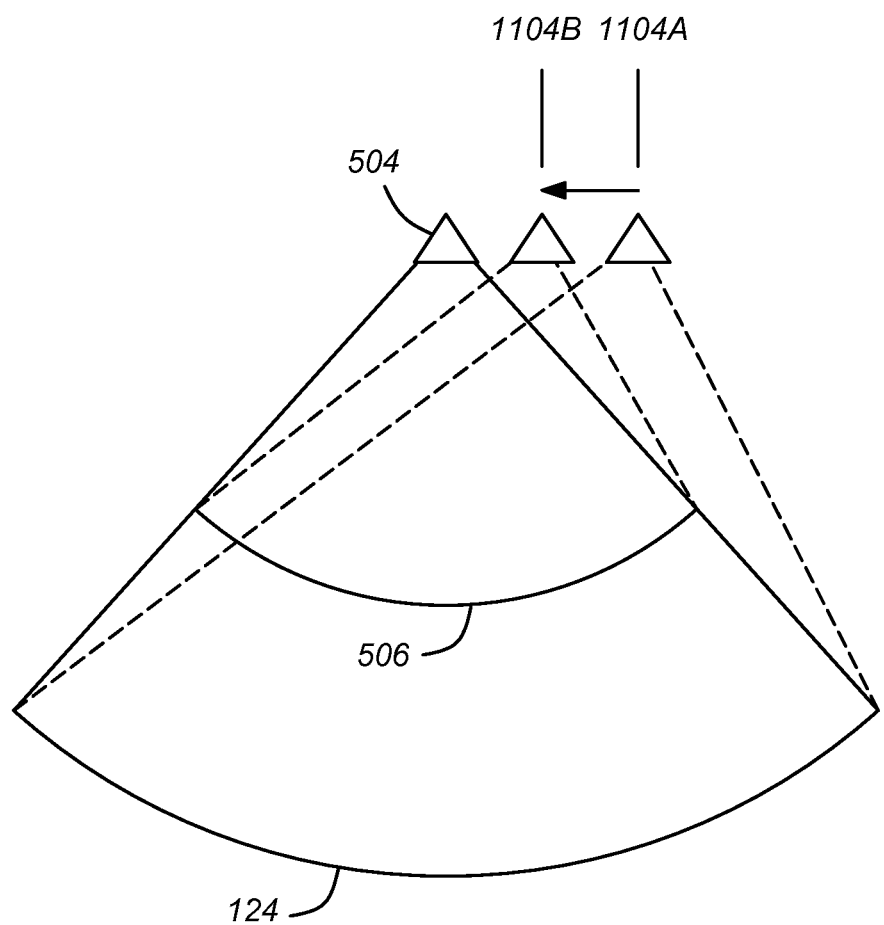

FIGS. 11A and 11B are diagrams showing how antenna measurement correlation for offset feeds can be improved. As shown in FIG. 11A, the offset feed when used with a full sized reflector 124 is at a distance $D_R$ from the primary feed 504 in the azimuth direction. When measurements are taken with the scaled reflector 506, the distance of the offset feed 1102 from the primary feed 504 is scaled by $R_{FL}$, placing the feed 1102 at a distance $D_r=R_{FL}D_R$ and permitting a high degree of correlation between measurements. This is also illustrated in FIG. 11B. Measurements taken for offset locations for the full sized reflector 124 and the scaled reflector 506 can be well correlated if the feed offset is similarly scaled. For example, to receive signals from satellites disposed in apparent positions offset from boresight (e.g. satellite 119 WL), the offset feed 1102 is disposed in location 1104A. Measurements taken with offset feed 1102 in the scaled position 1104B with scaled reflector 506 results in measurements highly correlated to those of offset feed 1102 in position 1104A with the full sized reflector 124.

Figure 12:
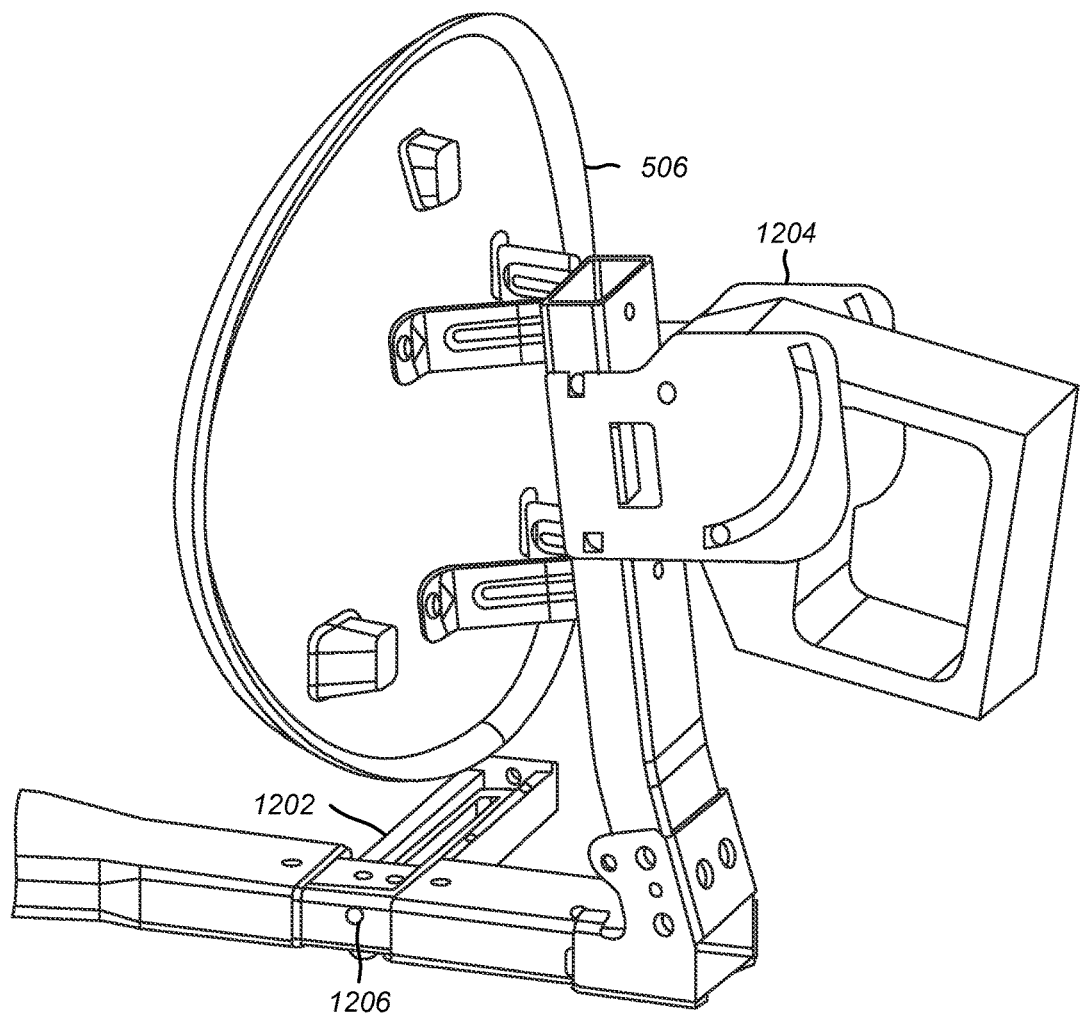
FIG. 12 is a diagram illustrating one embodiment of test antenna configuration using an adjustable feed arm.

FIG. 12 is a diagram illustrating one embodiment of test antenna configuration using a scaled reflector 506, a boom 1206 and an adjustable feed arm 1202 to position the feed 1102 at an location laterally displaced and offset from the primary feed in the azimuth direction. Note that although the separation of the feeds in a multi-feed LNBF is fixed, each of the feeds can be placed where desired using the adjustable arm. Hence, the center feed can be placed at the azimuthal centerline of the reflector 504 to test the antenna characteristics using the center feed, and to test an adjacent feed, the multi-feed LNBF (and hence, the adjacent feed) can be moved using the adjustable arm to place the adjacent feed at the scaled offset distance $D_r$ for the measurement of the antenna characteristics with the adjacent feed at the scaled offset distance $D_r$.

Figure 13:
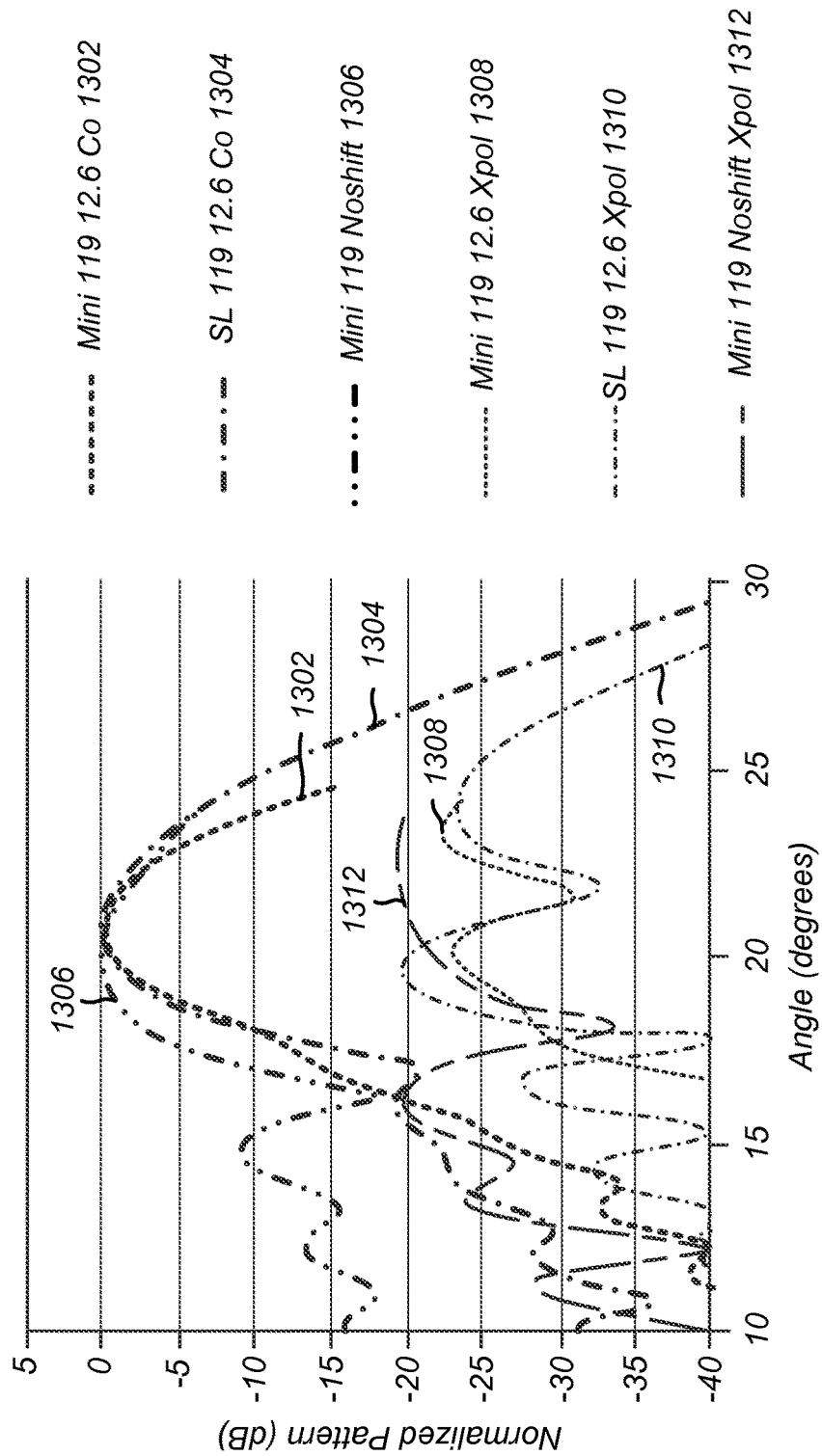
FIG. 13 is a diagram showing computer-simulated differences in normalized antenna co-pol (co-polarization) and cross-pol (cross-polarization) patterns for a feed azimuthally offset from the focus of the reflector.

FIG. 13 is a diagram showing the differences in antenna gain for a feed azimuthally offset from the focus 603 of the reflector. Results presented include plot 1304, which describes the antenna pattern for a full-sized reflector 124, which includes a built-in offset for the feed; plot 1306, which describes the antenna pattern for a scaled reflector 506 with the operational shift distance and no further horizontal shifting adjustment of the feed antenna, and plot 1302, which describes antenna pattern for a scaled reflector and the feed location re-shifted in the azimuthal direction for a net shift of $D_r=R_{FL}D_R$. Noteworthy is the fact that the antenna pattern with the scaled reflector 504 is more highly correlated with the antenna pattern with the full sized reflector 126 when the shifted feed location is scaled, as shown by the closer correlation between plots 1302 and 1304 at the peak and at other angles.

The dashed lines presented in FIG. 13 show similar results when cross polarization is the measured antenna characteristic. Plot 1310 illustrates cross polarization rejection for a full sized reflector and the feed at a distance $D_R$. Plot 1312 shows cross polarization for a scaled test reflector 504 with at the distance $D_R$ and plot 1308 show the result for a scaled reflector and the feed at scaled distance $D_r$. Note again that the results using the scaled re-shift 1308 in the feed location more closely match the results 1310 of the full sized reflector 126 than the unscaled shift in the feed location 1312.

Measured Test Results

Figure 14A:
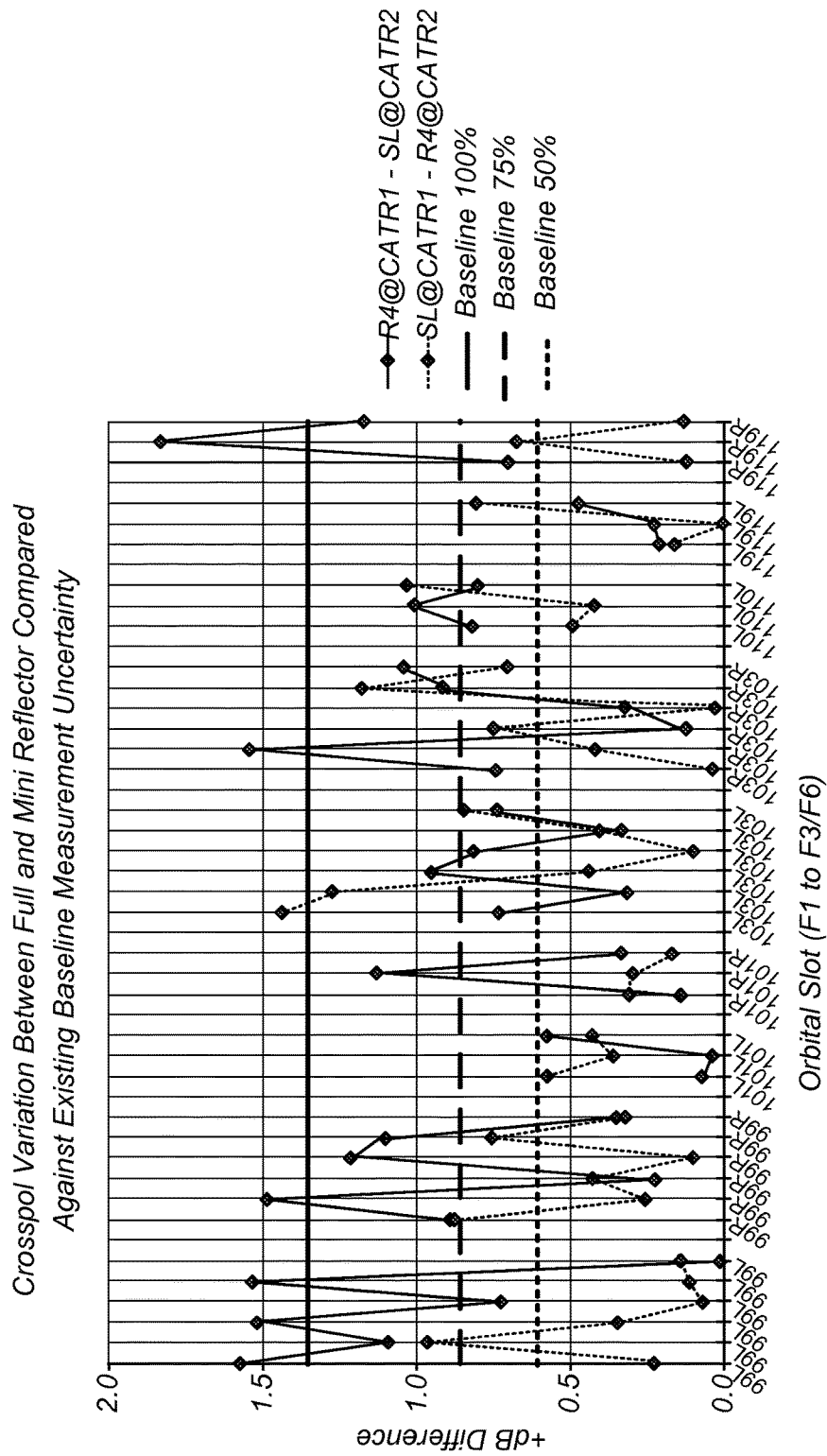
FIGS. 14A-14C illustrate actual measured test results of antenna cross polarization rejection and adjacent satellite rejection, and compare the results with existing range uncertainty.
Figure 14B:
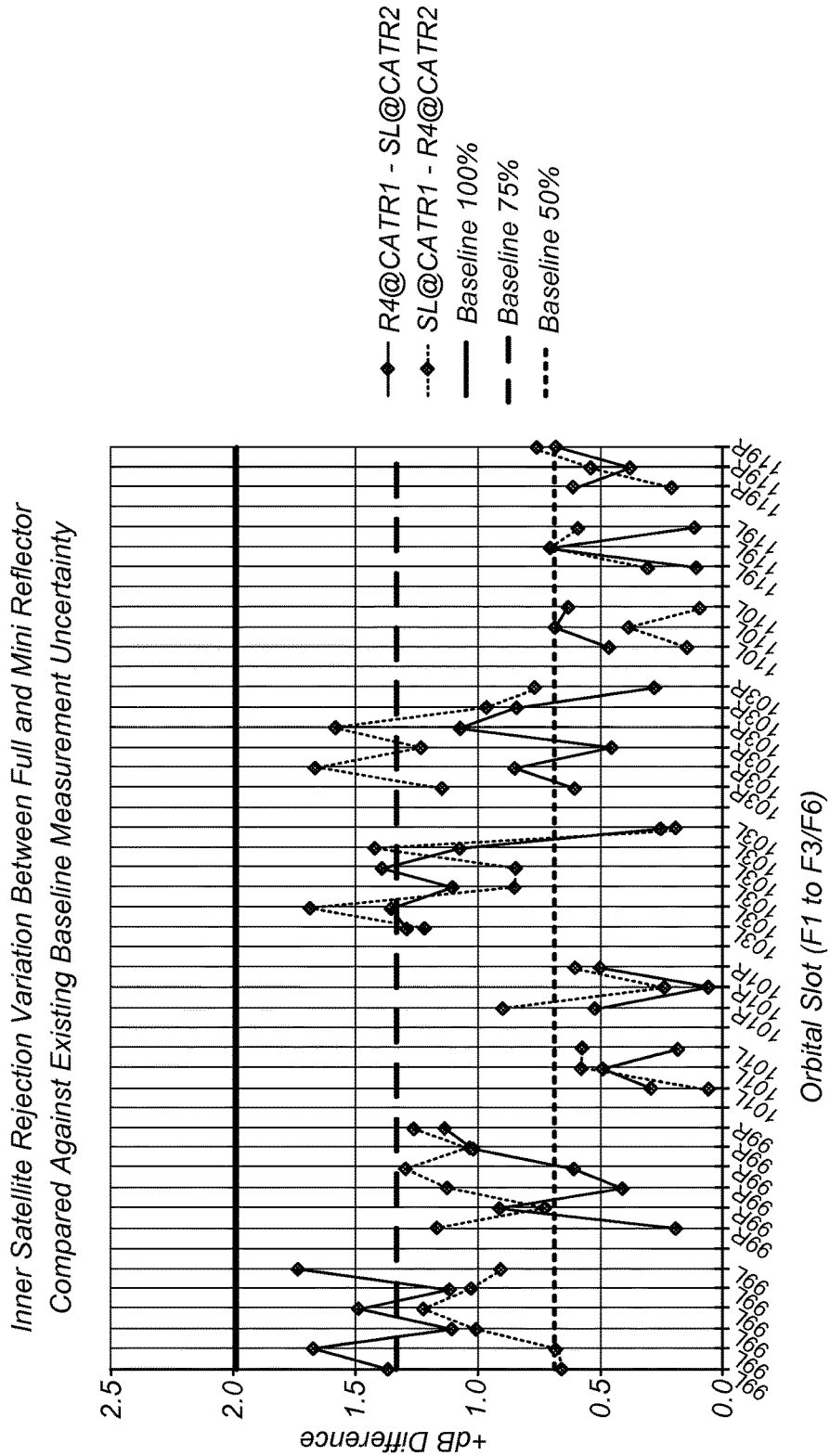
Figure 14C:
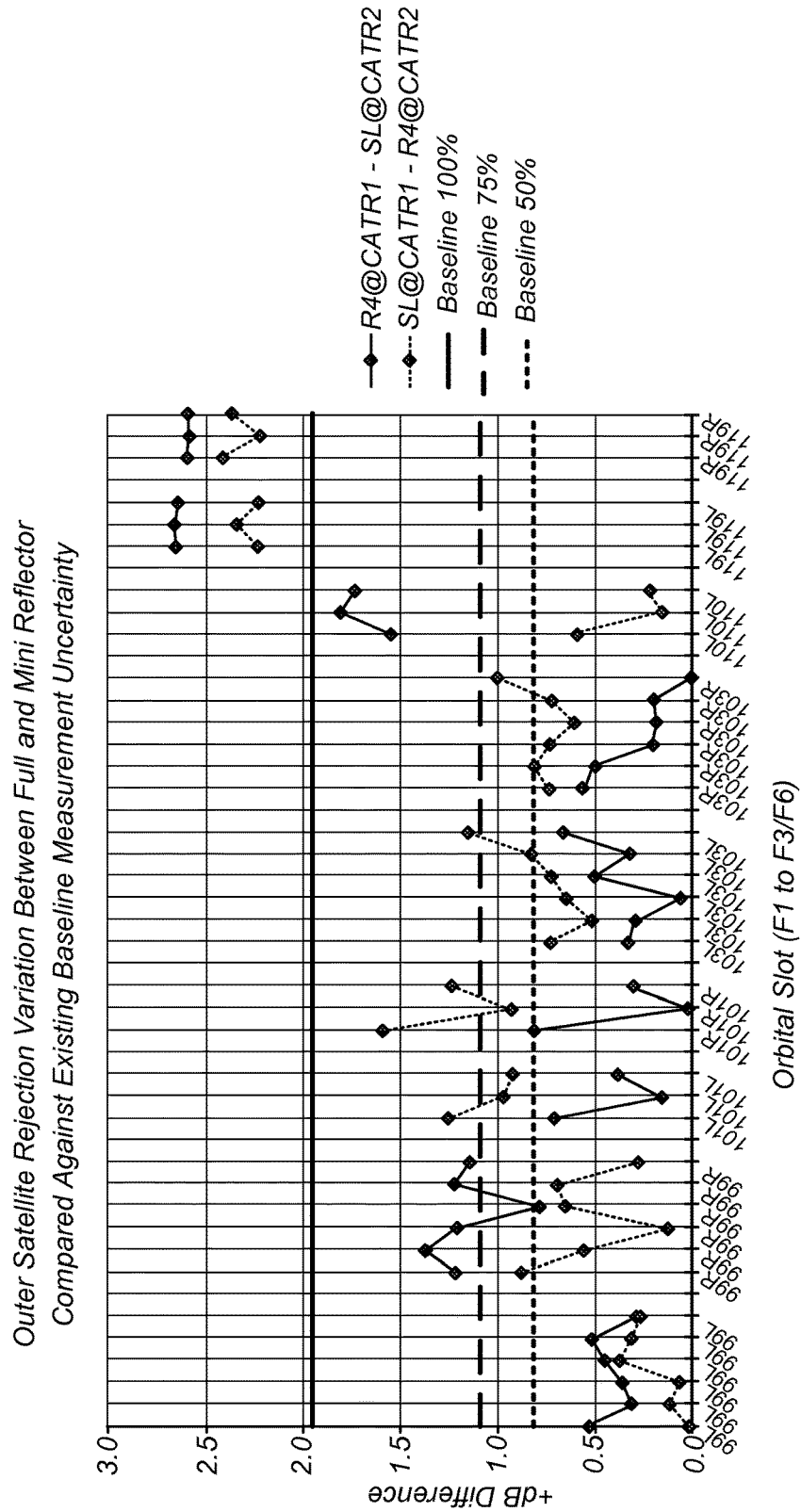

The foregoing comparisons between measurements taken with a full size reflector 126 and a scaled reflector 504 were theoretical values based upon an assumed normal distribution of electromagnetic energy. FIGS. 14A to 14C illustrate actual measured test results of antenna cross polarization rejection and ASR using the techniques described above. Inner and outer satellite rejection relates to a centered satellite generated by a focused feed on the reflector (DR=0). Inner satellite rejection for an off-focused feed is towards the centered satellite location from either side. For a focused feed, inner and outer satellite rejection are the same.

These measurements were taken with a passive antenna feed without block converting electronics as well as an LNBF 126 (feed with low noise block converter electronics). Only the LNBF 126 results are shown since LNBF includes the effect the passive feed. Thirty-nine data points were measured at frequencies ranging from 12.2-12.7 GHz and 18.3-20.2 GHz at various feed horn positions. As a reference, a baseline measurement uncertainty is established by measuring the same LNBF 126 on full size reflector 124 in two different CATRs (CATR1 and CATR2) and calculating the measured differences. This is the existing measurement uncertainty when two independent CATR measurements were taken on the same LNBF. The measured differences are shown in quartiles to summarize the max, median and 75% the population for ease of comparison.

FIGS. 14A-14C presents the difference (in dB) between measurements taken with a full size reflector 124 and, a scaled (mini) reflector 504 in two different CATRs. The "baseline" values plotted in FIGS. 14A-14C refer to the normal range variation using a standard (SL) antenna reflector in the two different CATRs (CATR1 and CATR2). R4@CATR1-SL@CATR2 refers to the variation between measurements of the mini-reflector at one test range (CATR1) and the standard antenna reflector at the second test range (CATR2, while SL@CATR1-R4@CATR2 refers to the variation between measurements of the standard reflector at the first test range and the mini reflector at the second test range. Note that in both cases, the difference is comparable the baseline measurement uncertainty. Similar correlation exists for antenna gain taken with full and scaled reflectors. This indicates that a full size reflector 124 can be replaced by a scaled reflector 504 without introducing additional measurement uncertainty to the existing technique. FIG. 14C shows that the 119 LR measurements are outside the baseline for the standard case, indicating less correlation. This is because the feed for the 119 LR location is furthest from the focal point, and therefore the most difficult to obtain good correlation.

Figure 15:
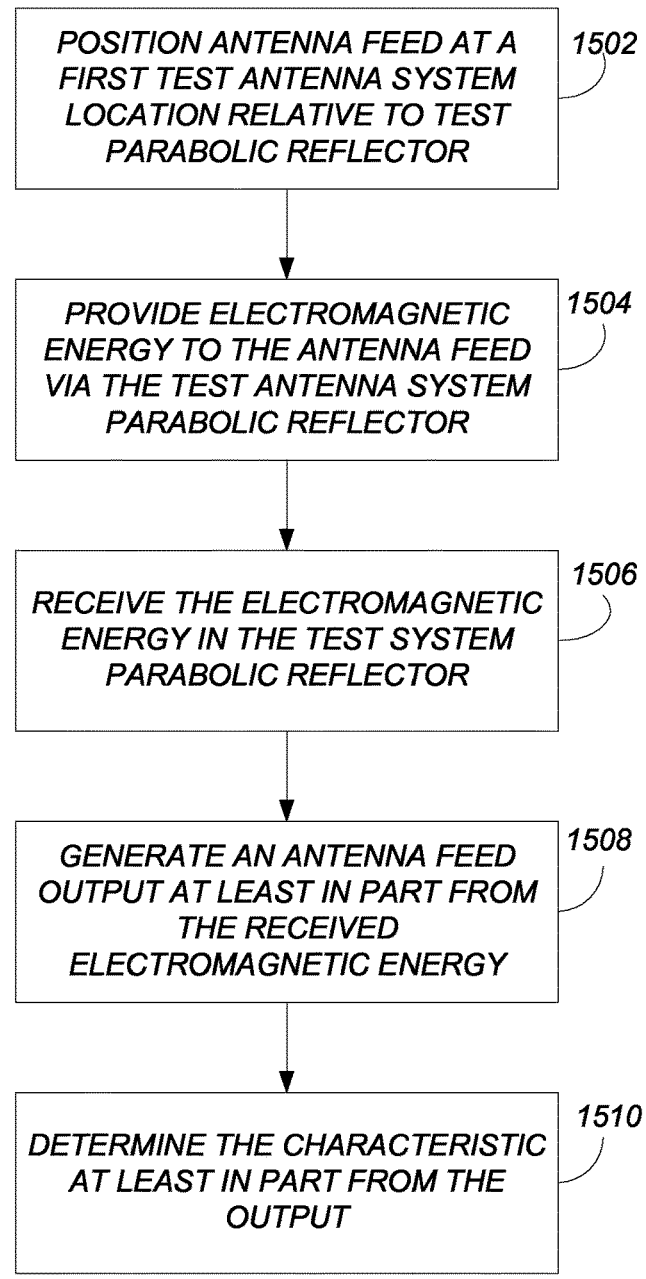
FIG. 15 is a diagram presenting illustrative method steps that can be used to practice one or more embodiments of the above described techniques.

FIG. 15 is a diagram presenting illustrative method steps that can be used to practice one or more embodiments of the above described techniques. In block 1502, an antenna feed is positioned at a first test antenna system location relative to a test parabolic reflector such as the scaled reflector 506 or the further scaled reflector 702.

The antenna feed 504 can be an LNBA or a simple feed without the low noise block converting electronics. In one embodiment, the focal length of the scaled antenna $F_r$ is equal to or greater than a far field distance of the antenna feed 504 from the scaled reflector 506 or further scaled reflector 702 or at a position shifted from the focal point $F_r$ by azimuthal distance $D_r$ as described above. Also in this embodiment, the scaled reflector 504 has a minor axis dimension $L_r$ scaled from the full-sized or operational antenna major axis dimension $W_R$ and a minor axis dimension $W_r$ scaled from the full sized or operation antenna dimension $L_R$ according to the above described scale factor $R_{FL}$ determined at least in part from a ratio of the full size reflector 124 focal length to the focal length of the scaled reflector ($F_r/F_R$), with the focal length $F_r$ determined as described above. Further, the location at which the feed is positioned is scaled from the full sized reflector 124 to the scaled reflector 504 by the $R_{FL}$ scale factor.

In one embodiment, the scaled antenna 506 is further scaled by a scale factor $P \leq 1$ as further described above. In an exemplary implementation $P > 0.67$ and $R_{FL} \approx 0.4$ Electromagnetic energy is provided to the antenna feed via the scaled reflector, as shown in block 1504. In one embodiment, feed 504 and scaled reflector 504 are disposed in a quiet zone 504 of an anechoic chamber such as a CATR 502, which uses a source feed 512 and a source reflector 510 to produce the electromagnetic energy with far field effect.

The reflected electromagnetic energy is received in the antenna feed, and an antenna feed output is generated at least in part from this energy, as shown in blocks 1506-1508. This can be performed by commanding the processor 514 to enable the LNBF controller 520 to activate the desired LNBF 504 at a particular polarization, receiving the electromagnetic energy in the LNBF 504, then supplying the antenna feed 504 output to an analyzer 522 which measures the antenna feed output to determine the antenna characteristic of interest.

Finally, the measured characteristic is determined at least in part from the antenna feed output, as shown in block 1510. The measured antenna characteristic may include for example, the cross polarization rejection or antenna gain pattern, or adjacent signal rejection.

In embodiments wherein the testing is performed over different angles between the antenna and the source of electromagnetic energy, the electromagnetic energy is provided at an angle from the test antenna sensitive axis. This may be implemented by changing the lateral position of the source antenna 511 or by simply rotating the test antenna, and measuring the feed output for different angles.

Hardware Environment

Figure 16:
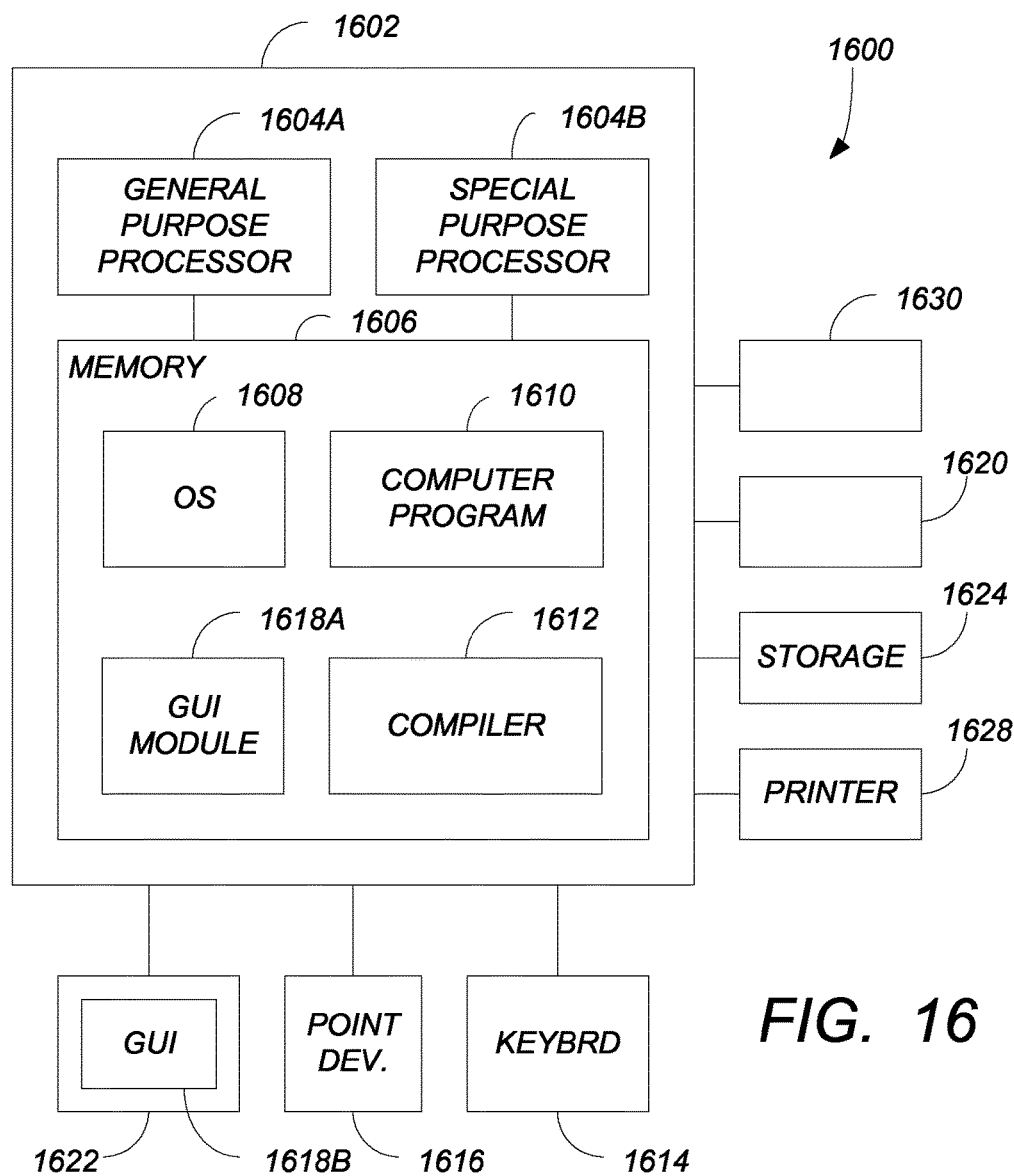
FIG. 16 is a diagram illustrating an exemplary computer system that could be used to implement elements of the system.

FIG. 16 is a diagram illustrating an exemplary computer system 1600 that could be used to implement elements of the system, including the processor 514, LNBF controller 520, analyzer 522, signal generator 516, and associated elements. The computer 1602 comprises a general purpose hardware processor 1604A and/or a special purpose hardware processor 1604B (hereinafter alternatively collectively referred to as processor 1604) and a memory 1606, such as random access memory (RAM). The computer 1602 may be coupled to other devices, including input/output (I/O) devices such as a keyboard 1614, a mouse device 1616 and a printer 1628.

In one embodiment, the computer 1602 operates by the general purpose processor 1604A performing instructions defined by the computer program 1610 under control of an operating system 1608. The computer program 1610 and/or the operating system 1608 may be stored in the memory 1606 and may interface with the user and/or other devices to accept input and commands and, based on such input and commands and the instructions defined by the computer program 1610 and operating system 1608 to provide output and results.

Output/results may be presented on the display 1622 or provided to another device for presentation or further processing or action. In one embodiment, the display 1622 comprises a liquid crystal display (LCD) having a plurality of separately addressable pixels formed by liquid crystals. Each pixel of the display 1622 changes to an opaque or translucent state to form a part of the image on the display in response to the data or information generated by the processor 1604 from the application of the instructions of the computer program 1610 and/or operating system 1608 to the input and commands. Other display 1622 types also include picture elements that change state in order to create the image presented on the display 1622. The image may be provided through a graphical user interface (GUI) module 1618A. Although the GUI module 1618A is depicted as a separate module, the instructions performing the GUI functions can be resident or distributed in the operating system 1608, the computer program 1610, or implemented with special purpose memory and processors.

Some or all of the operations performed by the computer 1602 according to the computer program 1610 instructions may be implemented in a special purpose processor 1604B. In this embodiment, some or all of the computer program 1610 instructions may be implemented via firmware instructions stored in a read only memory (ROM), a programmable read only memory (PROM) or flash memory within the special purpose processor 1604B or in memory 1606. The special purpose processor 1604B may also be hardwired through circuit design to perform some or all of the operations to implement the features of this disclosure. Further, the special purpose processor 1604B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 1602 may also implement a compiler 1612 which allows an application program 1610 written in a programming language such as COBOL, C++, FORTRAN, or other language to be translated into processor 1604 readable code. After completion, the application or computer program 1610 accesses and manipulates data accepted from I/O devices and stored in the memory 1606 of the computer 1602 using the relationships and logic that was generated using the compiler 1612.

The computer 1602 also optionally comprises an external communication device such as a modem, satellite link, Ethernet card, or other device for accepting input from and providing output to other computers.

In one embodiment, instructions implementing the operating system 1608, the computer program 1610, and/or the compiler 1612 are tangibly embodied in a computer-readable medium, e.g., data storage device 1620, which could include one or more fixed or removable data storage devices, such as a zip drive, floppy disc drive 1624, hard drive, CD-ROM drive, tape drive, or a flash drive. Further, the operating system 1608 and the computer program 1610 are comprised of computer program instructions which, when accessed, read and executed by the computer 1602, causes the computer 1602 to perform the steps necessary to implement and/or use the apparatus or methods or to load the program of instructions into a memory, thus creating a special purpose data structure causing the computer to operate as a specially programmed computer executing the method steps described herein. Computer program 1610 and/or operating instructions may also be tangibly embodied in memory 1606 and/or data communications devices 1630, thereby making a computer program product or article of manufacture. As such, the terms "article of manufacture," "program storage device" and "computer program product" or "computer readable storage device" as used herein are intended to encompass a computer program accessible from any computer readable device or media.

Of course, those skilled in the art will recognize that any combination of the above components, or any number of different components, peripherals, and other devices, may be used with the computer 1602.

Although the term "computer" is referred to herein, it is understood that the computer may include portable devices such as cellphones, portable MP3 players, video game consoles, notebook computers, pocket computers, or any other device with suitable processing, communication, and input/output capability.

CONCLUSION

This concludes this disclosure. The foregoing features have been presented for the purposes of illustration and description. It is not intended to be exhaustive or to limit the invention to the precise form disclosed. Many modifications and variations are possible in light of the above teaching. It is intended that the scope of methods and systems disclosed herein be limited not by this detailed description, but rather by the claims appended hereto.

What is claimed is:

1. A method of determining a characteristic comprising a cross-polarization of an operational antenna system having an offset operational antenna feed at a first operational antenna system location relative to an operational antenna system parabolic reflector characterized by an operational antenna system parabolic reflector focal length $F_R$, an operational antenna system parabolic reflector minor axis dimension $L_R$, and an operational antenna system parabolic reflector major axis dimension $W_R$, comprising the steps of:
   positioning the operational antenna feed at a first test antenna system feed location relative to a test antenna parabolic reflector, the test antenna parabolic reflector comprising:
   a test antenna parabolic reflector focal length $F_r$, smaller than the operational antenna system parabolic reflector focal length $F_R$;
   a test antenna parabolic reflector major axis dimension $W_r$, scaled from the operational antenna system parabolic reflector major axis dimension $W_R$ according to a scale factor $R_{FL}$ determined at least in part from a ratio ($R_{FL}$) of the test antenna parabolic reflector focal length ($F_r$) to the operational antenna system parabolic reflector focal length ($F_R$)($F_r/F_R=R_{FL}$); and
   a test antenna system parabolic reflector minor axis dimension $L_r$, scaled from the operational system parabolic reflector minor axis dimension $L_R$ according to the scale factor $R_{FL}$;
   wherein the first test antenna system feed location is scaled relative to the test antenna parabolic reflector from the first operational antenna system location relative to the test antenna parabolic reflector according to the scale factor $R_{FL}$;
   providing electromagnetic energy to the operational antenna feed via the test antenna system parabolic reflector;
   receiving the electromagnetic energy in the operational antenna feed and generating an operational antenna feed output at least in part therefrom; and
   determining the cross-polarization of the operational antenna system at least in part from the output;
   wherein the test antenna parabolic reflector minor and major axis dimensions $L_r$ and $W_r$ are further scaled by a second scale factor P, wherein $P \leq 1$.

2. The method of claim 1, wherein the operational antenna feed and the test antenna parabolic reflector are disposed in a quiet zone of an anechoic chamber further comprising a source of the electromagnetic energy.

3. The method of claim 2, wherein the source of the electromagnetic energy comprises a source antenna including a source feed directing the electromagnetic to the test reflector via a source reflector.

4. The method of claim 1, wherein $P \geq 0.67$ and wherein $R_{FL}=0.4$.

5. The method of claim 1, wherein:
   the characteristic further comprises adjacent signal rejection or antenna gain;
   the operational antenna system is characterized by an operational antenna system sensitive axis;
   the test antenna system is characterized by a test antenna system sensitive axis;
   the step of providing electromagnetic energy to the operational antenna feed via the test antenna parabolic reflector comprises the step of providing electromagnetic energy to the operational antenna feed at an angle from the test antenna system sensitive axis; and
   the step of determining the characteristic at least in part from the output comprises determining the adjacent signal rejection or antenna gain at least in part from the generated operational antenna feed output at the angle from the test antenna system sensitive axis.

6. The method of claim 1, wherein:
   the operational antenna system feed location is disposed at a focal point of the operational antenna system parabolic reflector, and the operational antenna system further comprises:
   a second operational antenna system feed, disposed at a second operational antenna system location laterally displaced in a direction from the first operational antenna system feed location by an operational antenna system feed displacement distance $D_R$;

the second operational antenna feed is positioned at a second test antenna system feed location laterally displaced from the first test antenna system feed location by a test antenna system feed displacement $D_r=D_R R_{FL}$;

wherein the operational antenna feed is positioned on a feed arm adjustable in the direction of the lateral displacement.

7. The method of claim 1, wherein the test antenna parabolic reflector focal length $F_r$ is equal to or greater than a far field distance of the operational antenna feed from the test antenna parabolic reflector.

8. An apparatus for determining a characteristic comprising a cross-polarization of an operational antenna system having an offset operational antenna feed a first operational antenna system location relative to a first operational antenna system parabolic reflector characterized by a first focal length $F_R$, a first minor axis dimension $L_R$, and a first major axis dimension $W_R$, comprising:

a test antenna parabolic reflector, comprising:
   a test antenna parabolic reflector focal length $F_r$ smaller than the first operational antenna system parabolic reflector focal length $F_R$;
   a test antenna major axis dimension $W_r$ scaled from the operational antenna system parabolic reflector major axis dimension $W_R$ according to a scale factor $R_{FL}$ determined at least in part from a ratio of the test antenna parabolic reflector focal length ($F_r$) to the operational antenna system parabolic reflector focal length ($F_R$)($F_r/F_R=R_{FL}$); and
   a test antenna system parabolic reflector minor axis dimension $L_r$ scaled from the operational system parabolic reflector minor axis dimension $L_R$ according to the scale factor $R_{FL}$;
a boom, for holding the operational antenna feed at first test antenna system location scaled relative to the test antenna parabolic reflector from the first operational antenna system location relative to the test antenna parabolic reflector according to the scale factor $R_{FL}$;
wherein the test antenna parabolic reflector minor and major axis dimensions $L_r$ and $W_r$ is further scaled by a second scale factor P, wherein P≤1.

9. The apparatus of claim 8, wherein P≥0.67 and wherein $R_{FL}=0.4$.

10. The apparatus of claim 8, wherein:
the first operational antenna system location is disposed at a focal point of the first operational antenna system parabolic reflector, and the operational antenna system further comprises:

a second operational antenna system feed, disposed at a second operational antenna system location laterally displaced in a direction from the first operational antenna system location by an operational antenna system feed displacement distance $D_R$; and the boom further comprises a feed arm for positioning the operational antenna feed at a second test antenna system location laterally displaced from the first test antenna system location by a test antenna system feed displacement $D_r=D_R R_{FL}$.

11. The apparatus of claim 10, wherein the feed arm is adjustable in the direction of the lateral displacement.

12. The apparatus of claim 8, further comprising:
an anechoic chamber, enclosing the operational antenna feed and the test antenna system parabolic reflector in a quiet zone and a source of electromagnetic energy.

13. The apparatus of claim 12, wherein the source of the electromagnetic energy comprises a source antenna including a source feed directing the electromagnetic energy to the test reflector via a source reflector.

14. The apparatus of claim 13, further comprising:
a signal generator, for generating the electromagnetic energy;
a polarity switch, communicatively coupled to the signal generator and the source feed, for selecting a polarization of the electromagnetic energy;
an analyzer, coupled to an output of the operational antenna feed, for measuring electromagnetic energy received by the operational antenna feed; and
an operational antenna feed controller, coupled to the operational antenna feed, for controlling a receiving mode of the operational antenna feed, the receiving mode defined according to a frequency band and polarization.

15. The apparatus of claim 14, further comprising:
a processor, communicatively coupled to the signal generator, polarity switch, analyzer and the operational antenna feed controller, for receiving data describing the measured electromagnetic energy received by the operational antenna feed from the analyzer, and for controlling the signal generator, the polarity switch, and the operational antenna feed controller.

16. The apparatus of claim 8, wherein the test antenna parabolic reflector focal length $F_r$ is equal to or greater than a far field distance of the operational antenna feed from the test antenna parabolic reflector.

\* \* \* \* \*